United States Patent
Einaga

(10) Patent No.: US 8,980,505 B2
(45) Date of Patent: *Mar. 17, 2015

(54) PHOTOSENSITIVE COLORED COMPOSITION, COLOR FILTER AND METHOD FOR PRODUCING THE SAME

(75) Inventor: Hiroyuki Einaga, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 640 days.

This patent is subject to a terminal disclaimer.

(21) Appl. No.: 12/867,669

(22) PCT Filed: Feb. 10, 2009

(86) PCT No.: PCT/JP2009/052218
§ 371 (c)(1),
(2), (4) Date: Aug. 13, 2010

(87) PCT Pub. No.: WO2009/101932
PCT Pub. Date: Aug. 20, 2009

(65) Prior Publication Data
US 2010/0323285 A1   Dec. 23, 2010

(30) Foreign Application Priority Data

Feb. 13, 2008  (JP) .................................. 2008-032220
Mar. 31, 2008  (JP) .................................. 2008-093839

(51) Int. Cl.
G02B 5/20  (2006.01)
G03F 7/004  (2006.01)

(52) U.S. Cl.
USPC .......................................... 430/7; 430/270.1

(58) Field of Classification Search
None
See application file for complete search history.

(56) References Cited

U.S. PATENT DOCUMENTS

| | | | |
|---|---|---|---|
| 4,195,999 | A | 4/1980 | Adachi et al. |
| 4,307,184 | A | 12/1981 | Beretta et al. |
| 4,946,768 | A | 8/1990 | Vallarino |
| 5,806,834 | A | 9/1998 | Yoshida |
| 6,100,312 | A | 8/2000 | Suzuki et al. |
| 8,492,071 | B2 * | 7/2013 | Taguchi ..................... 430/281.1 |
| 2007/0254240 | A1 | 11/2007 | Sasaki et al. |

FOREIGN PATENT DOCUMENTS

| | | |
|---|---|---|
| GB | 1 523 472 | 8/1978 |
| GB | 2 118 315 A | 10/1983 |
| JP | 62-014149 A | 1/1987 |
| JP | 2002-323762 A | 11/2002 |
| JP | 2003-025524 A | 1/2003 |
| JP | 2003-025525 A | 1/2003 |
| JP | 2004-315594 A | 11/2004 |
| JP | 2006-011397 A | 1/2006 |
| JP | 2006-309125 A | 11/2006 |
| JP | 2007-017814 A | 1/2007 |
| JP | 2007-034119 A | 2/2007 |
| JP | 2007-065640 | 3/2007 |
| JP | 2007-072163 * | 3/2007 |
| JP | 2007-72163 A | 3/2007 |
| JP | 2007-108275 A | 4/2007 |
| JP | 2007-293127 A | 11/2007 |
| KR | 10-2007-0057993 A | 6/2007 |
| WO | 2006/035807 A1 | 4/2006 |

OTHER PUBLICATIONS

Translation of KR-2007-0057993(Jun. 2007).*
Translation JP-2007-072163(Mar. 2007).*
Communication, dated Jan. 25, 2011, issued in corresponding EP Application No. 09710455.8, 11 pages.
Notice of Reasons for Rejection, dated Mar. 6, 2012, issued in corresponding JP Application No. 2008-093839, 5 pages in English and Japanese.
Office Action mailed on May 23, 2013 from the Korean Patent Office in counterpart Korean Application No. 10-2010-7020304, Partial Translation.

* cited by examiner

Primary Examiner — John A. McPherson
(74) Attorney, Agent, or Firm — Sughrue Mion, PLLC

(57) ABSTRACT

There is provided a photosensitive colored composition including a pigment, a polymerizable monomer, a photopolymerization initiator, and a compound represented by a general formula (I) [Each of $R^1$ and $R^2$ independently represents a hydrogen atom, an alkyl group with 1 to 20 carbon atoms, or an aryl group with 6 to 20 carbon atoms, where although $R^1$ and $R^2$ may be the same or different from each other, $R^1$ and $R^2$ do not represent a hydrogen atom at the same time. $R^1$ and $R^2$ may form a cyclic amino group with a nitrogen atom; and each of $R^3$ and $R^4$ independently represents an electron withdrawing group.]

General Formula (I)

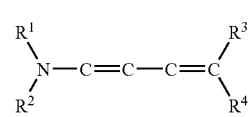

13 Claims, No Drawings

PHOTOSENSITIVE COLORED COMPOSITION, COLOR FILTER AND METHOD FOR PRODUCING THE SAME

TECHNICAL FIELD

The present invention relates to a photosensitive colored composition including a pigment as a colorant, a color filter using the photosensitive colored composition, and the method for producing the color filter.

BACKGROUND ART

A color filter used for a liquid crystal display device (LCD) or an image sensor (CCD, CMOS, or the like) is configured by regularly arranging fine colored patterns of red (R), green (G), and blue (B) in general, and of magenta (M), cyan (C), yellow (Y), and black (K) in some cases on a glass substrate or a wafer. Conventionally, pixels constituting the color filter have been produced by a dyeing method, a printing method, a pigment dispersion method, an electrodeposition method or the like.

In any of these methods, the pixels are sequentially formed for each color. In particular, the pigment dispersion method makes it possible to achieve high pattern precision and a stable producing process. Accordingly, the color filter is produced by this method in most cases.

In the pigment dispersion method, a cured film (colored pixel) formed to have a desirable pattern is obtained generally by coating on a substrate a photosensitive colored composition including a colorant, a polymerizable monomer, and a photopolymerization initiator, performing a pre-baking to form a film, then irradiating the film with ultraviolet rays or the like through a desirable mask to cure the irradiated portion, removing the unirradiated portion by a developing process to form a colored pattern, and further subjecting the resultant object to a thermal process. This method is a method which applies a principle that the irradiation with the ultraviolet rays causes the photopolymerization initiator to generate an activated radical, and the activated radical attacks a polymerizable group such as a (meth)acryloyl group and provokes a polymerization reaction. That is, the activated radical is essential to initiate the polymerization.

In order to obtain an excellent resolution and a proper line width by the pigment dispersion method, various methods such as an adjustment of an amount by which the activated radical is generated, that is, an adjustment of the type and the amount of the photopolymerization initiator and the like have been contrived hitherto. For example, when the line width to be finally obtained is wide, a method has been applied in which the amount of the activated radical is reduced by using an initiator with a low sensitivity, by reducing the amount of the initiator to be used, or the like and thereby the line width is adjusted to be proper.

However, more severe requirements for the width of the product specification have been introduced in recent years. It has been necessary to reduce the variations in the line width, the film thickness, the scattering spectrum, and the like due to the dependency on the exposing illuminance. That is, variation in the pattern shapes to be formed tends to be easily caused when the exposure is performed with a low illuminance as compared with the case of forming a pattern by exposing with a high illuminance, for example. Regarding these problems due to the dependency on the exposing illuminance, the problem which is hard to solve, especially for the color with a high i-ray transmittance, simply by adjusting the type and the amount of the photopolymerization initiator as described above. A method of increasing the amount of the photopolymerization initiator is generally employed in order to improve the dependency on the exposing illuminance. When the amount of the photopolymerization initiator is increased, on the contrary, the line width becomes excessively wide, and the circumferential residue due to the halation in the exposure is easily generated.

As a method for solving the above-mentioned dependency on the exposing illuminance, a technique for improving the resolution of the pattern with the use of antioxidant has been disclosed and reducing the illuminance of the exposure apparatus (see, for example, Japanese Patent Application Laid-Open (JP-A) No. 2006-11397). In addition, a technique for reducing the dependency on the exposing illuminance and improving the resolution of the pattern with the use of another type of antioxidant has been proposed (see, for example, JP-A-2003-25524, and JP-A-2003-25525).

DISCLOSURE OF THE INVENTION

Problem to be Solved by the Invention

According to the above techniques using the antioxidants, it is not possible to suppress the changing in the line width, the film thickness, the scattering spectrum, and the like of the pattern to be formed, when the exposure is performed especially with a low illuminance (for example, an illuminance of not higher than 95% of a high illuminance). Accordingly, it is difficult to stably form a satisfactorily shaped pattern.

The present invention was made from the above viewpoint. There is a demand to provide a photosensitive colored composition which can suppress the dependency on the exposing illuminance (especially the variations in the shape such as a line width under the condition of a low illuminance of not higher than 95% of a high illuminance) to be low, achieve a high ratio of the remaining film and less developing residue, and stably form the pattern with an excellent resolution. In addition, there is a demand to provide a color filter capable of displaying fine images with a high quality and a method for producing the color filter.

Means for Solving the Problems

Specific methods for achieving the above object are as follows:

<1> There is provided a photosensitive colored composition including: a pigment; a polymerizable monomer; a photopolymerization initiator; and a compound represented by a following general formula (I):

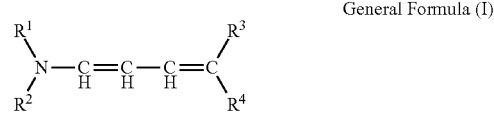

General Formula (I)

In the general formula (I), each of $R^1$ and $R^2$ independently represents a hydrogen atom, an alkyl group with 1 to 20 carbon atoms, or an aryl group with 6 to 20 carbon atoms. Although $R^1$ and $R^2$ may be the same or different from each other, $R^1$ and $R^2$ do not represent a hydrogen atom at the same time. $R^1$ and $R^2$ may form a cyclic amino group with a nitrogen atom. Each of $R^3$ and $R^4$ independently represents an electron withdrawing group.

<2> According to the photosensitive colored composition of the above-mentioned <1>, the content of the compound represented by the general formula (I) is 0.01 to 10% by mass relative to the total solid content of the photosensitive colored composition.

<3> According to the photosensitive colored composition of the above-mentioned <1> or <2>, at least one kind of the photopolymerization initiator is an oxime ester compound.

<4> According to the photosensitive colored composition of any one of the above-mentioned <1> to <3>, it is preferable that each of $R^1$ and $R^2$ independently represents a lower alkyl group with 1 to 8 carbons, or a substituted or unsubstituted phenyl group.

<5> According to the photosensitive colored composition of any one of the above-mentioned <1> to <4>, it is preferable that the electron withdrawing group represented by $R^3$ or $R^4$ is an electron withdrawing group whose $\sigma_p$ value is from 0.30 to 0.80.

<6> According to the photosensitive colored composition of any one of the above-mentioned <1> to <5>, it is preferable that $R^3$ is a group selected from a cyano group, —$COOR^5$, —$CONHR^5$, —$COR^5$, and —$SO_2R^5$, and $R^4$ is a group selected from a cyano group, —$COOR^6$, —$CONHR^6$, —$COR^6$, and —$SO_2R^6$. At this time, each of $R^5$ and $R^6$ independently represents an alkyl group with 1 to 20 carbon atoms or an aryl group with 6 to 20 carbon atoms.

<7> According to the photosensitive colored composition of any one of the above-mentioned <1> to <6>, it is preferable that the photopolymerization initiator is an oxime ester compound, and it is more preferable that the photopolymerization initiator is at least one of 2-(O-benzoyl oxime)-1-[4-(phenylthio)phenyl]-1,2-octanedione and 1-(O-acetyl oxime)-1-[9-ethyl-6-(2-methylbenzoyl)-9H-carbazole-3-yl]ethanone.

<8> According to the photosensitive colored composition of any one of the above-mentioned <1> to <7>, it is preferable that the pigment is a pigment for forming a red color, and the photosensitive colored composition.

<9> There is provided a method for producing a color filter including: applying the photosensitive colored composition of any one of the above-mentioned <1> to <8> as a coating layer, exposing the thus formed coating layer via a photomask, and developing the coating layer to form a pattern.

<10> There is provided a color filter produced by the method for producing the color filter of the above-mentioned <9>.

Effect of the Invention

According to the present invention, it is possible to provide a photosensitive colored composition which can suppress the dependency on the exposing illuminance (especially the variations in the shape such as a line width or the like under the condition of a low illuminance of not higher than 95% of a high illuminance) to be low, achieve a high ratio of the remaining film ratio and less developing residue, and stably form the pattern with an excellent resolution. In addition, according to the present invention, it is possible to provide a color filter capable of displaying fine images with a high quality and a method for producing the color filter.

BEST MODE FOR CARRYING OUT THE INVENTION

Hereinafter, the description will be made in detail of the photosensitive colored composition, the color filter constituted by using this photosensitive colored composition, and the method for producing the color filter according to the present invention.

<Photosensitive Colored Composition>

The photosensitive color composition according to the present invention is composed by using at least a pigment, a polymerizable monomer, a photopolymerization initiator, and a compound represented by a general formula (I), which will be described later, as an ultraviolet absorber. A solvent is generally used. In addition, the photosensitive colored composition of the present invention can be composed by further using other components such as a pigment dispersant and/or a pigment derivative, an alkali-soluble resin, and the like, if necessary.

In the present invention, a photosensitive composition, which contains a pigment as a colorant, is composed by using an ultraviolet absorber with a specific structure. Accordingly, it is possible to suppress the dependency on the illuminance at the time of the exposure, especially the changing in the developing performance when the developing is performed by the pattern exposure under the condition of a low illuminance (for example, an illuminance of not higher than 95% of a high illuminance). Therefore, it is possible to reduce the changing in shapes such as variations in a ratio of the remaining film after the developing, variations in the developing residue, changing in the pattern width, and the like, and to thereby stably form a pattern with an excellent resolution.

Hereinafter, the detailed description will be made of the respective components constituting the photosensitive colored composition of the present invention.

[1] Pigment

The photosensitive colored composition of the present invention contains at least one kind of pigment.

Various types of conventionally known inorganic or organic pigments can be employed as the pigment. When it is considered that a pigment capable of obtaining a high transmittance in forming the film is preferable regardless that the pigment is an inorganic pigment or an organic pigment, a pigment with a fine particle size, which has a particle diameter which is as small as possible, is preferable. When the handling property is also taken into consideration, a pigment with an average primary particle diameter of 0.01 to 0.3 is preferably used, and a pigment with an average primary particle diameter of 0.01 to 0.15 μm is more preferably used. When the average primary particle diameter is in the above ranges, it is possible to achieve a high transmittance and satisfactory chromatic characteristics, and the color filter with a high contrast is effectively formed.

The average primary particle diameter is obtained by observing with a scanning electron microscope (SEM) or a transmission electron microscope (TEM), measuring the sizes of 100 particles in the portion where the particles are not aggregated, and calculating the average value thereof.

Examples of inorganic pigments include a metal compound such as a metal oxide, a metal complex salt, or the like. Specifically, examples of inorganic pigments include a metal oxide of iron, cobalt, aluminum, cadmium, lead, copper, titanium, magnesium, chromium, zinc, antimony, or the like and a composite oxide of the above metals.

Examples of organic pigments include:

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279;

C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214;

C.I. Pigment Orange 2, 5, 13, 16, 17:1, 31, 34, 36, 38, 43, 46, 48, 49, 51, 52, 55, 59, 60, 61, 62, 64, 71, 73;

C.I. Pigment Green 7, 10, 36, 37;

C.I. Pigment Blue 1, 2, 15, 15:1, 15:2, 15:3, 15:4, 15:6, 16, 22, 60, 64, 66, 79, 79 of which Cl substituent group is replaced with OH, 80;

C.I. Pigment Violet 1, 19, 23, 27, 32, 37, 42;

C.I. Pigment Brown 25, 28;

C.I. Pigment Black 1, 7; and the like.

Examples of preferable pigments among them include the following. However, the pigment in the present invention is not limited thereto.

C.I. Pigment Yellow 11, 24, 108, 109, 110, 138, 139, 150, 151, 154, 167, 180, 185;

C.I. Pigment Orange 36, 71;

C.I. Pigment Red 122, 150, 171, 175, 177, 209, 224, 242, 254, 255, 264;

C.I. Pigment Violet 19, 23, 32;

C.I. Pigment Blue 15:1, 15:3, 15:6, 16, 22, 60, 66;

C.I. Pigment Green 7, 36, 37;

C.I. Pigment Black 1, 7.

In the present invention, it is possible to use an organic pigment of which the particle sizes are fine and regulated, if necessary. Making the particle sizes of the pigment fine is a process of grinding the pigment with a water-soluble organic solvent, and water-soluble inorganic salts as a liquid composition with a high viscosity. Specifically, the process is disclosed in paragraphs [0030] to [0032] of JP-A-2007-112934. As the disclosure in the paragraph [0034] of the same citation, it is possible to obtain a fine pigment by dissolving the mixture after the grinding in warm water of 80° C. with the water-soluble organic solvent and the water-soluble inorganic salts, filtering the dissolved mixture, washing the filtered object with water, and drying the resultant object using an oven.

One kind of organic pigment can be used alone, and various combinations of organic pigments can be used as well in order to enhance the chromatic purity. Specific examples of the combinations include the following.

For example, as a pigment for forming a red color, it is possible to use a mixture of a single one or at least one kind from among an anthraquinone-based pigment, a perylene-based pigment, and a diketopyrrolopyrrole-based pigment with a disazo-based yellow pigment, an isoindoline-based yellow pigment, a quinophthalone-based yellow pigment or a perylene-based red pigment, an anthraquinone-based red pigment, and a diketopyrrolopyrrole-based red pigment. Examples of the anthraquinone-based pigment include C.I. Pigment Red 177, examples of the perylene pigment include C.I. Pigment Red 155 and C.I. Pigment Red 224, and examples of the diketopyrrolopyrrole-based pigment include C.I. Pigment Red 254.

From the view point of the color reproducibility, it is preferable to mix with C.I. Pigment Yellow 83, C.I. Pigment Yellow 139, or C.I. Pigment Red 177.

In addition, the mass ratio between the red pigment and another color pigment is preferably in the range of 100:5 to 100:80. When the mass ratio is not less than 100:5, it is possible to suppress the light transmittance in the range of 400 nm to 500 nm, and to thereby enhance the chromatic purity. When the mass ratio is not more than 100:80, it is possible to achieve satisfactory color generation. Particularly, the range of 100:10 to 100:65 is the optimum range for the mass ratio. In addition, when plural red pigments are used in a combination, it is possible to adjust the mass ratio in accordance with the chromaticity.

As a pigment for forming a green color, it is possible to use a halogenated phthalocyanine pigment alone or a mixture of the halogenated phthalocyanine pigment with a disazo-based yellow pigment, a quinophthalone-based yellow pigment, an azomethine-based yellow pigment or an isoindoline-based yellow pigment. As such an example, it is preferable to use a mixture of C.I. Pigment Green 7, 36, 37 with C.I. Pigment Yellow 83, C.I. Pigment Yellow 138, C.I. Pigment Yellow 139, C.I. Pigment Yellow 150, C.I. Pigment Yellow 180 or C.I. Pigment Yellow 185.

The mass ratio between the green pigment and the yellow pigment is preferably in the range from 100:5 to 100:200. When the mass ratio is not less than 100:5, it is possible to suppress the transmittance of the light in the range of 400 nm to 450 nm, and to thereby enhance the chromatic purity. When the mass ratio is not more than 100:200, it is possible to prevent the main wavelength from being unbalanced over a long wavelength, and thereby to avoid the deviation from NTSC color standards. Particularly, the range of 100:20 to 100:150 is preferable for the mass ratio.

As a pigment for forming a blue color, it is possible to use a phthalocyanine-based pigment alone or a mixture of the phthalocyanine-based pigment with a dioxazine violet pigment. Particularly preferable examples include a mixture of C.I. Pigment Blue 15:6 with C.I. Pigment Violet 23.

The mass ratio between the blue pigment and the violet pigment is preferably in the range of 100:0 to 100:100, and more preferably in the range of not more than 100:70.

As a preferable pigment for the use for a black matrix, it is possible to use a carbon black, a graphite, a titanium black, an iron oxide, or a titanium oxide alone or a mixture thereof. Preferable examples include a combination of the carbon black and the titanium black.

In addition, the mass ratio between the carbon black and the titanium black is preferably in the range from 100:0 to 100:60. When the mass ratio is not less than 100:61, the dispersion stability may be lowered in some cases.

The content of the pigment in the photosensitive colored composition is preferably 1 to 30% by mass with respect to the total solid content (mass) of the composition, and more preferably 3 to 20% by mass. When the content of the pigment is in the above ranges, the chromatic characteristic with a sufficient color density is effectively secured.

[2] Pigment Dispersant

The photosensitive colored composition of the present invention can contain at least one kind of pigment dispersant for dispersing the pigment. When the pigment dispersant is contained, it is possible to improve the dispersibility of the pigment in the composition.

As the pigment dispersant, for example, it is possible to appropriately select and use a conventionally known pigment dispersant or surfactant. Many kinds of compounds can be used, and specific examples include: a cationic surfactant such as organo-siloxane polymer KP341 (manufactured by Shin-Etsu Chemical Co., Ltd.), (meth)acrylic acid-based (co) polymer polyflow No. 75, No. 90, No. 95 (manufactured by Kyoeisha Chemical Co., Ltd.), W001 (manufactured by Yusho Co., Ltd.), or the like; a nonionic surfactant such as a polyoxyethylene lauryl ether, a polyoxyethylene stearyl ether, a polyoxyethylene oleyl ether, a polyoxyethylene octyl phenyl ether, a polyoxyethylene nonylphenyl ether, a polyethylene glycol dilaurate, a polyethylene glycol distearate, a sorbitan fatty acid ester, or the like; an anionic surfactant such as W004, W005, W017 (manufactured by Yusho Co., Ltd.); a polymer dispersant such as EFKA-46, EFKA-47, EFKA-47EA, EFKA POLYMER 100, EFKA POLYMER 400, EFKA POLYMER 401, EFKA POLYMER 450 (all of which are manufactured by Chiba Specialty Chemicals Inc.), DISPERSE AID 6, DISPERSE AID 8, DISPERSE AID 15, DISPERSE AID 9100 (all of which are manufactured by San Nopco Limited), or the like; various types of Solsperse dispersants such as SOLSPERSE 3000, 5000, 9000, 12000, 13240, 13940, 17000, 24000, 26000, 28000, or the like (manufactured by Zeneca Corporation); and ADEKA PLURONIC L31, F38, L42, L44, L61, L64, F68, L72, P95, F77, P84, F87, P94, L101, P103, F108, L121, P-123 (manufactured by Adeka Corporation), ISONET S-20 (manufactured by Sanyo Chemical Industries, Ltd.), and DISPERBYK 101, 103, 106, 108, 109, 111, 112, 116, 130, 140, 142, 162, 163, 164, 166, 167, 170, 171, 174, 176, 180, 182, 2000, 2001, 2050, 2150 (manufactured by BYK Additives & Instruments). In addition to the above compounds, the examples also include an oligomer or a polymer having a molecular end or a side chain with a polar group, such as an acrylic copolymer.

The content of the pigment dispersant in the photosensitive colored composition is preferably 1 to 100% by mass with respect to the mass of the above-mentioned pigment, and more preferably 3 to 70% by mass.

[3] Pigment Derivative

It is possible to add the pigment dispersant with a pigment derivative to the photosensitive colored composition of the present invention, if necessary. It is possible to cause the pigment to disperse as fine particles in the photosensitive colored composition by causing the pigment derivative, to which a part or polar group having an affinity for the pigment dispersant is introduced, to be adsorbed to the pigment surface, and using this as an adsorbing point for the pigment dispersant. It is also possible to prevent the pigment from aggregating again, and thereby to constitute a color filter with a high contrast and an excellent transparency.

Specifically, the pigment derivative is a compound which contains an organic pigment as a parent structure and has introduced as a substituent group an acidic group, a basic group, or an aromatic group for the side chain. Specific examples of the organic pigment here include a quinacridone-based pigment, phthalocyanine-based pigment, azo-based pigment, quinophthalone-based pigment, isoindoline-based pigment, isoindolinon-based pigment, quinoline-based pigment, diketopyrrolopyrrole-based pigment, benzimidazolone-based pigment and the like. The examples also include a light yellow aromatic polycyclic compound such as a naphthalene-based compound, an anthraquinone-based compound, a triazine-based compound, a quinoline-based compound, or the like, which is not called a dye in general. As a dye derivative, it is possible to use the one disclosed in JP-A-11-49974, JP-A-11-189732, JP-A-10-245501, JP-A-2006-265528, JP-A-8-295810, A-11-199796, JP-A-2005-234478, JP-A-2003-240938, JP-A-2001-356210, or the like.

The content of the pigment derivative in the photosensitive colored composition is preferably 1 to 30% by mass of the mass of the pigment, and more preferably 3 to 20% by mass. When the content is in the above ranges, it is possible to satisfactorily perform the dispersion while suppressing the viscosity to be low, and improve the dispersion stability after the dispersion. Accordingly, it is possible to achieve an excellent chromatic characteristic with a high transmittance. In addition, when a color filter is produced, it is possible to configure the color filter to have a high contrast with a satisfactory chromatic characteristic.

A dispersion is performed by a method of mixing and dispersing the pigment with the pigment dispersant in advance with a homogenizer or the like and carrying out finely dispersion with a bead disperser, which employs zirconia beads or the like (for example, DISPERMAT manufactured by VMA-GETZMANN GMBH). The time for the dispersion is preferably about 3 to 6 hours.

[4] Compound Represented by General Formula (I)

The photosensitive colored composition of the present invention contains as an ultraviolet absorber at least one kind of compound represented by the following general formula (I), which is a conjugated diene compound. In the present invention, it is possible to suppress the changing in the developing performance especially after performing the exposure with a low illuminance by using this conjugated diene compound, and to thereby suppress the dependency on the exposing illuminance which relates to pattern forming properties such as a line width of a pattern, a film thickness, a scattering spectrum, and the like.

General Formula (I)

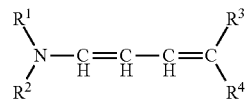

In the general formula (I), each of $R^1$ and $R^2$ independently represents a hydrogen atom, an alkyl group with 1 to 20 carbon atoms, or an aryl group with 6 to 20 carbon atoms. Although $R^1$ and $R^2$ may be the same or different from each other, $R^1$ and $R^2$ do not represent a hydrogen atom at the same time.

Examples of the alkyl group with 1 to 20 carbon atoms, which is represented by $R^1$ or $R^2$, include a methyl group, an ethyl group, a propyl group, an n-butyl group, an n-hexyl group, a cyclohexyl group, an n-decyl group, an n-dodecyl group, an n-octadecyl group, an eicosyl group, a methoxyethyl group, an ethoxypropyl group, a 2-ethylhexyl group, a hydroxy ethyl group, a chloropropyl group, an N,N-diethylamino propyl group, a cyanoethyl group, a phenethyl group, a benzyl group, a p-t-butylphenethyl group, a p-t-octyl phenoxy ethyl group, a 3-(2,4-di-t-amylphenoxy)propyl group, an ethoxycarbonyl methyl group, a 2-(2-hydroxyethoxy) ethyl group, a 2-furylethyl group, or the like. A methyl group, an ethyl group, a propyl group, an n-butyl group, an n-hexyl group are preferable.

The alkyl group represented by $R^1$ and $R^2$ may have a substituent group. Examples of the substituent group of the alkyl group, which has the substituent group, include an alkyl group, an aryl group, an alkoxy group, an allyloxy group, an acyloxy group, a halogen atom, an acylamino group, an acyl group, an alkylthio group, an arylthio group, a hydroxy group, a cyano group, an alkyloxy carbonyl group, an allyloxy carbonyl group, a substituted carbamoyl group, a substituted sulfamoyl group, a nitro group, a substituted amino group, an alkyl sulfonyl group, an allyl sulfonyl group, or the like.

The aryl group with 6 to 20 carbon atoms, which is represented by $R^1$ or $R^2$, may be monocyclic or may be a condensed ring, and may be any one of a substituted aryl group with a substituent group and an unsubstituted aryl group. Examples thereof include a phenyl group, a 1-naphthyl group, 2-naphthyl group, an anthryl group, a phenanthryl group, an indenyl group, an acenabutenyl group, a fluorenyl group or the like. Examples of the substituent group of the substituted aryl group, which has the substituent group, include an alkyl group, an aryl group, an alkoxy group, an allyloxy group, an acyloxy group, a halogen atom, an acylamino group, an acyl group, an alkylthio group, an arylthio group, a hydroxy group, a cyano group, an alkyloxy carbonyl group, an allyloxy carbonyl group, a substituted carbamoyl group, a substituted sulfamoyl group, a nitro group, a substituted amino group, an alkyl sulfonyl group, an allylsulfonyl group, or the like. Among the above examples, a substituted or unsubstituted phenyl group, a 1-naphthyl group, and a 2-naphtyl group are preferable.

In addition, $R^1$ and $R^2$ may form a cyclic amino group with a nitrogen atom. Examples of the cyclic amino group include a piperidino group, a morpholino group, a pyrrolidino group, a hexahydroazepine group, a piperazino group, or the like.

Among the above examples, a lower alkyl group with 1 to 8 carbons (for example, methyl, ethyl, isopropyl, butyl, sec-butyl, tert-butyl, pentyl, tert-pentyl, hexyl, octyl, 2-ethylhexyl, tert-octyl, or the like), or a substituted or unsubstituted phenyl group (for example, a tolyl group, a phenyl group, an anisyl group, a mesityl group, a chlorophenyl group, a 2,4-di-t-amyl phenyl group or the like) is preferable as $R^1$ and $R^2$. It is also preferable that $R^1$ and $R^2$ are combined to form a ring (for example, a piperidine ring, a pyrrolidine ring, a morpholine ring, or the like) while containing a nitrogen atom represented by N in the formula.

In the general formula (I), $R^3$ and $R^4$ represent an electron withdrawing group. The electron withdrawing group here is an electron withdrawing group whose Hammett substituent group constant $\sigma_p$ value (hereinafter, simply referred to as a "$\sigma_p$ value") is from 0.20 to 1.0. Preferably, the electron withdrawing group is an electron withdrawing group whose $\sigma_p$ value is from 0.30 to 0.80.

The Hammett rule is an experimental rule which was proposed by L. P. Hammett in 1935 in order to quantitatively discuss an influence of a substituent group on a reaction or a balance of a benzene derivative. The validity of this rule is widely admitted these days. Substituent group constants obtained by the Hammett rule include $\sigma_p$ value and $\sigma_m$ value, and description regarding these values can be found in many general books. For example, the detail thereof can be found in "Lange's Handbook of Chemistry" $12^{th}$ edition, edited by J. A. Dean, 1979 (McGraw Hill), "Kagaku no Ryoiki (Journal of Japanese Chemistry) special edition" vol. 122, pp 96-103, 1979 (Nankodo), and "Chemical Reviews" vol. 91, pp 165-195, 1991. It does not mean that the substituent group of the present invention is limited to a substituent group with values known by these documents. As long as the value of the substituent group is within the above ranges when measured based on the Hammett rule, the substituent group with the value may be included in the electron withdrawing group even when the value is not known by these documents.

Specific examples of the electron withdrawing group with the $\sigma_p$ value from 0.20 to 1.0 include an acyl group, an acyloxy group, a carbamoyl group, an alkyloxy carbonyl group, an aryloxy carbonyl group, a cyano group, a nitro group, a dialkyl phosphono group, a diaryl phosphono group, a diaryl phosphinyl group, an alkyl sulfinyl group, an aryl sulfinyl group, an alkyl sulfonyl group, an aryl sulfonyl group, a sulfonyloxy group, an acylthio group, a sulfamoyl group, a thiocyanate group, a thiocarbonyl group, an alkyl group substituted by at least two or more halogen atoms, an alkoxy group substituted by at least two or more halogen atoms, an allyloxy group substituted by at least two or more halogen atoms, an alkyl amino group substituted by at least two or more halogen atoms, an alkylthio group substituted by at least two or more halogen atoms, an aryl group substituted by another electron withdrawing group with the $\sigma_p$ value of not less than 0.20, a heterocyclic group, a chlorine atom, a bromine atom, an azo group, or a selenocyanate group. Groups capable of further including a substituent group, from among these substituent groups, may further include the substituent group as described above.

Among above examples, $R^3$ is preferably a group selected from a cyano group, —$COOR^5$, —$CONHR^5$, —$COR^5$, and —$SO_2R^5$, and $R^4$ is preferably a group selected from a cyano group, —$COOR^6$, —$CONHR^6$, —$COR^6$, and —$SO_2R^6$ in the present invention. Each of $R^5$ and $R^6$ independently represents an alkyl group with 1 to 20 carbon atoms or an aryl group with 6 to 20 carbon atoms. The alkyl group with 1 to 20 carbon atoms and the aryl group with 6 to 20 carbon atoms, which are represented by $R^5$ and $R^6$, have the same definitions as $R^1$ and $R^2$, and the preferable configurations thereof are the same as well.

Among these examples, $R^3$ and $R^4$ are preferably an acyl group, a carbamoyl group, an alkyloxy carbonyl group, an aryloxy carbonyl group, a cyano group, a nitro group, an alkyl sulfonyl group, an aryl sulfonyl group, a sulfonyloxy group, a sulfamoyl group, and more preferably an acyl group, a carbamoyl group, an alkyloxy carbonyl group, an aryloxy carbonyl group, a cyano group, an alkyl sulfonyl group, an aryl sulfonyl group, a sulfonyloxy group, a sulfamoyl group.

In addition, $R^3$ and $R^4$ may be combined with each other to form a ring.

In addition, at least one of $R^1$, $R^2$, $R^3$, and $R^4$ may be a form of a polymer which is derived from a monomer combined with a vinyl group via a linking group, or may be a copolymer with another monomer.

When at least one of $R^1$, $R^2$, $R^3$, and $R^4$ is a copolymer, examples of another monomer include an acrylic acid, an α-chloroacrylic acid, an α-alacrylic acid (for example, an ester which is derived from acrylic acids such as a methacrylic acid, preferably a lower alkyl ester and an amide (for example, an acrylamide, a methacrylamide, a t-butyl acrylamide, a methyl acrylate, a methyl methacrylate, an ethyl acrylate, an ethyl methacrylate, an n-propyl acrylate, an n-butyl acrylate, a 2-ethylhexyl acrylate, an n-hexyl acrylate, an octyl methacrylate, a lauryl methacrylate, a methylene bisacrylamide or the like)), a vinyl ester (for example, a vinyl acetate, a vinyl propionate, a vinyl laurate, or the like), an acrylonitrile, a methacrylonitrile, an aromatic vinyl compound (for example, a styrene and a derivative thereof such as a vinyl toluene, a divinyl benzene, a vinyl acetophenone, a sulfostyrene, a styrene sulfinic acid, or the like), an itaconic acid, a citraconic acid, a crotonic acid, a vinylidene chloride, a vinyl alkyl ether (for example, a vinyl ethyl ether or the like), an ester maleate, an N-vinyl-2-pyrrolidone, N-vinyl pyridine, 2- and 4-vinyl pyridine, or the like. Among these examples, an acrylic acid ester, a methacrylic acid ester, and an aromatic vinyl compound are particularly preferable.

It is also possible to use two or more kinds of comonomer compound together. For example, it is possible to use an n-butyl acrylate and a divinyl benzene, a styrene and a methyl methacrylate, a methyl acrylate and a methacrylic acid, or the like.

Hereinafter, preferable specific examples [Example Compounds (1) to (14)] of the compound represented by the general formula (I) will be shown. However, the present invention is not limited thereto.

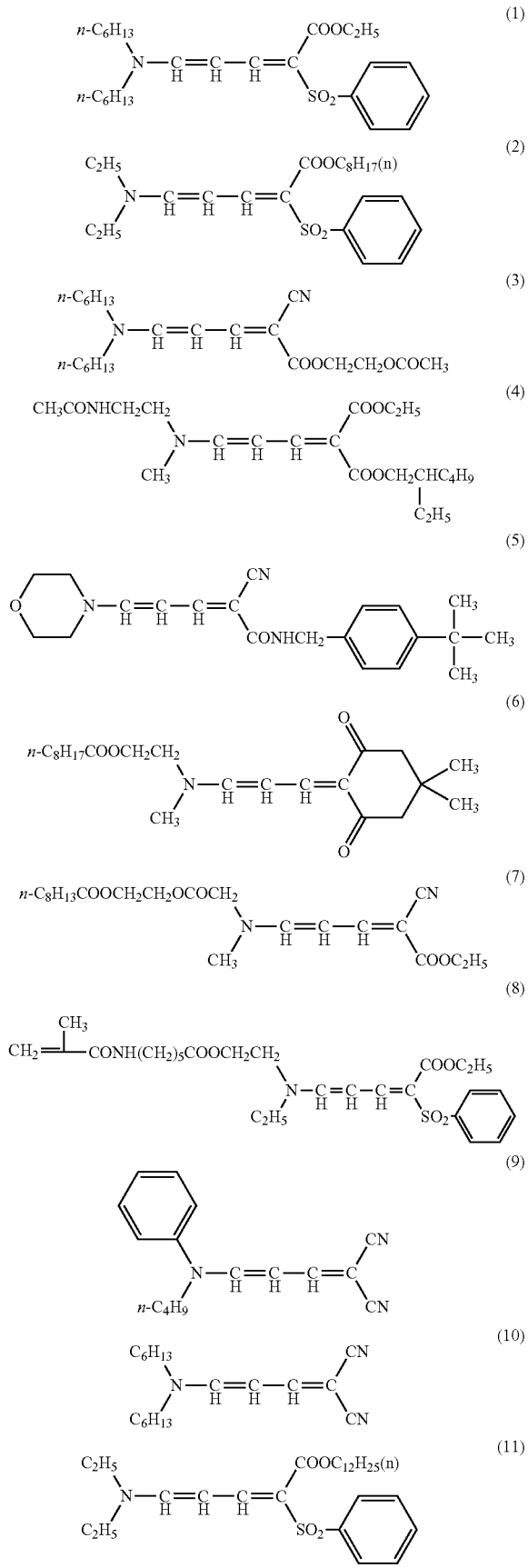
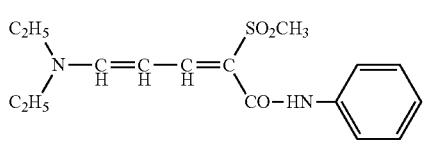
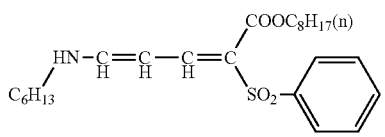
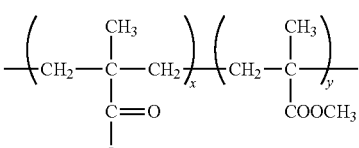
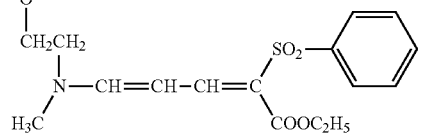

x:y = 80:20
(MASS RATIO)

The compound, which is represented by the general formula (I), in the present invention can be synthesized by a method disclosed in Japanese Patent Publication No. (JP-B) 44-29620, JP-A-53-128333, JP-A-61-169831, JP-A-63-53543, JP-A-63-53544, or JP-A-63-56651.

Hereinafter, the description will be made of the specific method of synthesizing a representative compound of the present invention.

—Synthesizing Method of Example Compound (1)—

A 3-anilinoacrolein anil (13.3 g) and an ethyl phenylsulfonyl acetate (14.3 g) are heated in an acetic-acid anhydride (40 ml) at 85 to 90° C. for 2 hours. The acetic-acid anhydride is removed under a depressurized and dry condition. An ethanol (40 ml) and a di-n-hexylamine (24.1 g) are added to flux the resultant object for 2 hours. The ethanol is removed, and the residue is then subjected to a column chromatography to purify the object. The object is recrystallized from the ethanol, and thereby a target object can be obtained (melting point=95 to 96° C.).

The content of the compound (conjugated diene compound) which is represented by the general formula (I), in the photosensitive colored composition of the present invention is preferably in the range of 0.01% by mass to 10% by mass of the total solid content of the composition, more preferably in the range of 0.01% by mass to 7.5% by mass, and particularly preferably in the range of 0.01% by mass to 5% by mass. When the content of this conjugated diene compound (ultraviolet absorber) is not less than 0.01% by mass, it is possible to achieve a satisfactory light shielding performance at the time of the exposure, and it is easy to obtain a desirable line width by preventing the pattern line width from being too wide due to the excessive proceeding of the polymerization. Accordingly, it is possible to further suppress the generation of the circumferential residue. In addition, when the content of the conjugated diene compound is not more than 10% by mass, the light shielding performance at the time of exposure is not too strong, and thereby the polymerization can satisfactorily proceed.

The changes in the pattern line width as described above may be markedly observed in the photosensitive colored composition of a magenta or red color, which absorbs less ultraviolet rays such as a g-ray, a h-ray, and an i-ray as an exposure light source. Accordingly, the compound represented by the general formula (I) (conjugated diene compound) is particularly effective when constituting the photosensitive colored composition of a magenta or red color.

[5] Photopolymerization Initiator

The photosensitive colored composition of the present invention contains at least one kind of photopolymerization initiator.

Examples of the photopolymerization initiator include a halomethyl oxadiazole disclosed in JP-A-57-6096, an activated halogen compound such as a halomethyl-s-triazine disclosed in JP-B-59-1281, JP-A-53-133428, or the like, an aromatic carbonyl compound such as a ketal, an acetal, a benzoin alkyl ethers, or the like disclosed in the respective specifications of U.S. Pat. No. 4,318,791, European Patent (EP)-88050A, or the like, an aromatic ketone compound such as benzophenones disclosed the specification of U.S. Pat. No. 4,199,420, a (thio) xanthones or an acridines compound disclosed in the specification of Fr-2456741, a compound such as coumalins, lophine dimmers, or the like disclosed in JP-A-10-62986, a sulfonium organic boron complex or the like disclosed in JP-A-8-015521 or the like.

As the photopolymerization initiator, it is preferable to use an acetophenone-based initiator, a ketal-based initiator, a benzophenone-based initiator, a benzoin-based initiator, a benzoyl-based initiator, a xanthone-based initiator, a triazin-based initiator, a halomethyl oxadiazole-based initiator, an acridines-based initiator, a coumalins-based initiator, a lophine dimmers-based initiator, a biimidazole-based initiator, an oxime ester-based initiator, or the like.

Preferable examples of the acetophenone-based photopolymerization initiator include a 2,2-diethoxy acetophenone, a p-dimethyl aminoacetophenone, a 2-hydroxy-2-methyl-1-phenyl-propane-1-one, a p-dimethyl aminoacetophenone, a 4'-isopropyl-2-hydroxy2-methyl-propiophenone, or the like.

Preferable examples of the ketal-based photopolymerization initiator include a benzyl dimethyl ketal, a benzyl-β-methoxyethyl acetal, or the like.

Preferable examples of the benzophenone-based photopolymerization initiator include a benzophenone, a 4,4'-(bis-dimethylamino)benzophenone, a 4,4'-(bisdiethylamino)ben-zophenone, a 4,4'-dichlorbenzophenon, an 1-hydroxy-cyclohexyl-phenyl-ketone, a 2-benzil-2-dimethylamino-1-(4-morpholinophenyl)-butanone-1,2-tolyl-2-dimethylamino-1-(4-morpholinophenyl)-butanone-1,2-methyl-1-[4-(methylthio)phenyl]-2-morpholinopropanone-1, or the like.

Preferable examples of the benzoin-based or benzoyl-based photopolymerization initiator include a benzoin isopropyl ether, a benzoin isobutyl ether, a benzoin methyl ether, a methyl-o-benzoyl benzoate, or the like.

Preferable examples of the xanthone-based photopolymerization initiator include a diethyl thioxanthone, a diisopropyl thioxanthone, a monoisopropyl thioxanthone, a chlorothioxanthone, or the like.

Preferable examples of the triazine-based photopolymerization initiator include a 2,4-bis(trichloromethyl)-6-p-methoxyphenyl-s-triazine, a 2,4-bis(trichloromethyl)-6-p-methoxystyryl-s-triazine, a 2,4-bis(trichloromethyl)-6-(1-p-dimethyl aminophenyl)-1,3-butadienyl-s-triazine, a 2,4-bis(trichloromethyl)-6-biphenyl-s-triazine, a 2,4-bis(trichloromethyl)-6-(p-methyl biphenyl)-s-triazine, p-hydroxy ethoxystyryl-2,6-di(trichloromethyl)-s-triazine, methoxystyryl-2,6-di(trichloromethyl-s-triazine, a 3,4-dimethoxystyryl-2,6-di(trichloromethyl)-s-triazine, 4-benzooxolan-2,6-di(trichloromethyl)-s-triazine, a 4-(o-bromo-p-N,N-(diethoxy carbonylamino)phenyl)-2,6-di (chloromethyl)-s-triazine, a 4-(p-N,N-(diethoxy carbonylamino)-phenyl)-2,6-di(chloromethyl)-s-triazine, or the like.

Preferable examples of the halomethyl oxadiazole-based photopolymerization initiator include a 2-trichloromethyl-5-styryl-1,3,4-oxodiazole, a 2-trichloromethyl-5-(cyanostyryl)-1,3,4-oxodiazole, a 2-trichloromethyl-5-(naphtho-1-yl)-1,3,4-oxodiazole, a 2-trichloromethyl-5-(4-styryl) styryl-1,3,4-oxodiazole, or the like.

Preferable examples of the acridines-based photopolymerization initiator include a 9-phenylacridine, an 1,7-bis(9-Acridinyl)heptane, or the like.

Preferable examples of the coumalins-based photopolymerization initiator include a 3-methyl-5-amino-((s-triazine-2-yl)amino)-3-phenyl coumalin, a 3-chloro-5-diethylamino-((s-triazine-2-yl)amino)-3-phenyl coumalin, a 3-butyl-5-dimethylamino-((s-triazine-2-yl)amino)-3-phenyl coumalin, or the like.

Preferable examples of the lophine dimers-based photopolymerization initiator include a 2-(o-chlorophenyl)-4,5-diphenyl imidazolyl dimmer, a 2-(o-methoxyphenyl)-4,5-diphenyl imidazolyl dimmer, a 2-(2,4-dimethoxy phenyl)-4,5-diphenyl imidazolyl dimmer, or the like.

Preferable examples of the biimidazole-based photopolymerization initiator include a 2-mercaptobenzimidazole, a 2,2'-benzothiazolyl disulfide, or the like.

Preferable examples of the oxime ester-based photopolymerization initiator include a 2-(O-benzoyl oxime)-1-[4-(phenylthio)phenyl]-1,2-octanedione, an 1-(O-acetyl oxime)-1-[9-ethyl-6-(2-methylbenzoyl)-9H-carbazole-3-yl] ethanone, an 1-phenyl-1,2-propanedione-2-(o-ethoxy carbonyl)oxime, an O-benzoyl-4'-(benzmercapto)benzoyl-hexyl-ketoxime, or the like.

The examples further include a 2,4,6-trimethylphenyl carbonyl-diphenyl phosphonyl oxide, a hexafluorophosphoro-triialkylphenyl phosphonium salt, or the like in addition to the above examples.

The photopolymerization initiator of the present invention is not limited to the above examples, and it is possible to use another known one. Examples of another known photopolymerization initiator include a vicinal polyketol aldonil compound disclosed in the specification of U.S. Pat. No. 2,367,660, an α-carbonyl compound disclosed in the specifications of U.S. Pat. No. 2,367,661 and U.S. Pat. No. 2,367,670, an acyloin ether disclosed in the specification of U.S. Pat. No. 2,448,828, an aromatic acyloin compound substituted by α-hydrocarbon disclosed in the specification of U.S. Pat. No. 2,722,512, a polynuclear quinone compound disclosed in the specifications of U.S. Pat. No. 3,046,127 and U.S. Pat. No. 2,951,758, a combination of triallyl imidazole dimmer/p-aminophenyl ketone disclosed in the specification of U.S. Pat. No. 3,549,367, a benzothiazole-based compound/a trihalomethyl-s-triazine-based compound disclosed in JP-A-51-48516, an oxime ester compound disclosed in J. C. S. Perkin II (1979) 1653-1660, J. C. S. Perkin II (1979) 156-162, Journal of Photopolymer Science and Technology (1995) 202-232, JP-A-2000-66385, or the like.

In addition, these photopolymerization initiators can be used in combination

An oxime ester-based compound is preferable from among the above-mentioned photopolymerization initiators from the view point that an oxime ester-based compound can exhibit a high sensitivity when added by a small amount and used in combination with a conjugated diene compound represented by the general formula (I). Most preferable examples include 2-(O-benzoyl oxime)-1-[4-(phenylthio)phenyl]-1,2-octanedione, 1-(O-acetyl oxime)-1-[9-ethyl-6-(2-methylbenzoyl)-9H-carbazole-3-yl]ethanone.

The content of the photopolymerization initiator in the photosensitive colored composition is preferably 0.1 to 10.0% by mass of the total solid content of the composition, more preferably 0.5 to 5.0% by mass. When the content of the photopolymerization initiator is in the above ranges, it is possible to cause the polymerization reaction to satisfactorily proceed, and to thereby form a film with a satisfactory strength.

It is preferable to further add a thermal polymerization inhibitor to the photosensitive colored composition of the present invention in addition to the above components. Useful examples of the thermal polymerization inhibitor include a hydroquinone, a p-methoxyphenol, a di-t-butyl-p-cresol, a pyrogallol, a t-butylcatechol, a benzoquinone, a 4,4'-thiobis(3-methyl-6-t-butylphenol), a 2,2'-methylene bis(4-methyl-6-t-buthylphenol), a 2-mercaptobenzoimidazole, or the like.

[6] Polymerizable Monomer

The photosensitive colored composition of the present invention contains at least one kind of polymerizable monomer.

As the polymerizable monomer, it is preferable to use a compound containing at least one ethylene double bond capable of undergoing an addition polymerization and having a boiling point of not less than 100° C. under ordinary pressure. It is possible to constitute the photosensitive colored composition of the present invention to be a negative type by causing the polymerizable monomer to be contained along with the photopolymerization initiator and the like.

Examples of the polymerizable monomer include a monofunctional acrylate or methacrylate such as a polyethylene glycol mono(meth)acrylate, a polypropylene glycol mono(meth)acrylate, a phenoxyethyl(meth)acrylate, or the like; (meth)acrylated resultant after adding ethylene oxide or propylene oxide to multifunctional alcohol such as a polyethylene glycol di(meth)acrylate, a trimethylolethane tri(meth) acrylate, a neopentyl glycol di(meth)acrylate, a pentaerythritol tri(meth)acrylate, a pentaerythritol tetra (meth)acrylate, a dipentaerythritol penta(meth)acrylate, a dipentaerythritol hexa(meth)acrylate, a hexanediol(meth) acrylate, a trimethylolpropane tri(acryloyloxy propyl)ether, a tri(acryloyloxy ethyl)isocyanurate, a glycerin, a trimethylol ethane, or the like; urethan acrylates disclosed in the respective publications of JP-B-48-41708, JP-B-50-6034, and JP-A-51-37193; polyester acrylates disclosed in the respective publications of JP-A-48-64183, JP-B-49-43191, and JP-B-52-30490; multifunctional acrylate or methacrylate such as epoxy acrylates, which is a reaction product of epoxy resin and (meth)acrylic acid, or the mixture thereof.

Moreover, the examples further include the ones which have been introduced as photo-curable monomers and oligomers in Journal of the Adhesion Society of Japan, vol. 20, No. 7, pp 300-308. Among these, a multifunctional (meth)acryl compound is preferable as the polymerizable monomer.

The content of the polymerizable monomer in the photosensitive colored composition is preferably 10 to 80% by mass of the total solid content of the composition, more preferably 10 to 40% by mass. When the content is in the above ranges, it is possible to hold a sufficient cure degree and an elution property of an unexposed portion, and sufficiently maintain a cure degree of an exposed portion. Accordingly, it is possible to prevent the elution property of the unexposed portion from being excessively lowered.

[7] Alkali-Soluble Resin

The photosensitive colored composition of the present invention can be constituted by using an alkali-soluble resin. The alkali-soluble resin is not particularly limited as long as it is alkali soluble. However, it is preferable to select the alkali-soluble resin from the view point of thermal resistance, developing performance, and availability.

As the alkali-soluble resin, it is preferable to use one which is a linear organic high molecular polymer, soluble in an organic solvent, and can be developed with a weakly alkaline aqueous solution. The examples of such a linear organic high molecular polymer include a polymer containing calboxylic acid at its side chain such as a methacrylic acid copolymer, an acrylic acid copolymer, an itaconic acid copolymer, a crotonic acid copolymer, a maleic acid copolymer, a partially esterified maleic acid copolymer, or the like, disclosed in the respective publications of JP-A-59-44615, JP-B-54-34327, JP-B-58-12577, JP-B-54-25957, JP-A-59-53836, and JP-A-59-71048, and an acidic cellulose derivative having carboxylic acid at its side chain in the same manner is useful.

In addition to the above examples, the useful examples of the alkali-soluble resin further include one obtained by adding acid anhydride to a polymer with a hydroxyl group, a polyhydroxy styrene resin, polysiloxiane resin, poly(2-hydroxyethyl(meth)acrylate), polyvinylpyrrolidone, polyethylene oxide, polyvinyl alcohol, or the like.

One obtained by copolymerizing a hydrophilic monomer is applicable as the linear organic high molecular polymer. Such examples include an alkoxyalkyl(meth)acrylate, a hydroxyalkyl(meth)acrylate, a glycerol(meth)acrylate, a (meth)acrylamide, an N-methylol acrylamide, a secondary or tertiary alkyl acrylamide, a dialkylaminoalkyl(meth)acrylate, a morpholine(meth)acrylate, an N-vinylpyrrolidone, an N-vinylcaprolactam, a vinyl imidazol, a vinyl triazole, a methyl(meth) acrylate, an ethyl(meth)acrylate, a branched or straight-chain propyl(meth)acrylate, a branched or straight-chain butyl (meth)acrylate, a phenoxy hydroxypropyl(meth)acrylate, or the like.

In addition, as the hydrophilic monomer, a monomer or the like containing a tetrahydrofurfuryl group, a phosphate group, an ester phosphate group, a quaternary ammonium salt group, an ethyleneoxy chain, a propylene oxy chain, a group derived from sulfonic acid or the salt thereof, morpholinoethyl group, or the like is also useful.

In order to improve cross-linkage efficiency, the alkali-soluble resin may contain a polymerizable group at its side chain. For example, a polymer or the like containing an allyl group, a (meth)acrylic group, an allyloxy alkyl group, or the like at its side chain is also useful.

Examples of the polymer containing a polymerizable group include commercially available KS RESIST-106 (manufactured by Osaka Organic Chemical Industry Ltd.), CYCLOMER-P SERIES (manufactured by Daicel Chemical Industries, Ltd.), or the like. In order to enhance the strength of the cured film, a polyether of alcohol-soluble nylon or a 2,2,-bis(4-hydroxyphenyl)-propane and epichlorohydrin is also useful.

Among these various kinds of alkali-soluble resin, it is preferable to use a polyhydroxy styrene resin, a polysiloxiane resin, an acryl resin, an acrylamide resin, an acryl/acrylamide copolymer resin, or the like from the view point of the thermal resistance, and an acryl resin, an acrylamide resin, an acryl/acrylamide copolymer resin from the view point of the control of the developing performance.

Preferable examples of the acryl resin include a copolymer which can be obtained by a polymerization of a monomer selected from a benzyl(meth)acrylate, a (meth)acrylic acid, a hydroxyethyl(meth)acrylate, a (meth)acrylamide and the like, commercially available KS RESIST-106 (manufactured by Osaka Organic Chemical Industry Ltd.), CYCLOMER-P SERIES (manufactured by Daicel Chemical Industries, Ltd.), or the like.

As the alkali-soluble resin, a polymer with a weight-average molecular weight (a polystyrene conversion value measured on the basis of GPC method) of 1000 to $2 \times 10^5$ is preferable, and a polymer with the weight-average molecular weight of 2000 to $1 \times 10^5$ is more preferable, and a polymer with the weight-average molecular weight of 5000 to $5 \times 10^4$ is most preferable from the view point of the developing property, a liquid viscosity, or the like.

The content of the alkali-soluble resin in the photosensitive colored composition is preferably 10 to 90% by mass of the total solid content of the composition from the view point of the developing performance, and more preferably 20 to 80% by mass, and particularly preferably 30 to 70% by mass.

[8] Organic Solvent

Generally, the photosensitive colored composition of the present invention can be constituted by using an organic solvent.

Basically, the organic solvent is not particularly limited as long as it can satisfy the dissolution property of the respective components and the coating property of the photosensitive colored composition. However, it is preferable to select the organic solvent while taking into account the dissolution properties, coating properties, and the safeties of the ultraviolet absorber and the binder. In addition, it is preferable to allow at least two kinds of organic solvents to be contained when preparing the photosensitive colored composition of the present invention.

Preferable examples of the organic solvent include esters such as ethyl acetate, acetic-n-butyl, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, or the like; alkyl esters 3-oxypropionic acid such as methyl 3-oxypropionate, ethyl 3-oxypropionate, or the like, for example, methyl 3-methoxypropionate, ethyl 3-methoxypropionate, methyl 3-ethoxypropionate, ethyl 3-ethoxypropionate, or the like; alkyl esters 2-oxypropionic acid such as methyl 2-oxypropionate, ethyl 2-oxypropionate, propyl 2-oxypropionate, or the like, for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, or the like; methyl pyruvate, ethyl pyruvate, propyl pyruvate, methyl acetoacetate, ethyl acetoacetate, methyl 2-oxobutyric, ethyl 2-oxobutyric, or the like;

ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, or the like; and ketones, for example, methyl ethyl ketone, cyclohexanone, 2-heptanone, 3-heptanone, or the like; aromatic hydrocarbons, for example, toluene, xylene, or the like.

As already mentioned above, these organic solvents may be used while not less than two kinds of them are mixed from the view points of the improvements in the dissolution property of the ultraviolet absorber and the alkali-soluble resin, and in the coating surface state. Particularly, it is preferable to use a mixture solution constituted by not less than two kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, propylene glycol methyl ether acetate.

The content of the organic solvent in the photosensitive colored composition is preferably 5 to 80% by mass of total solid content concentration of the composition, more preferably 5 to 60% by mass, and particularly preferably 10 to 50% by mass from the view point of the coating property.

[9] Other Additive

It is possible to mix various additives, if necessary, such as a filler, polymer compounds other than the above compounds, a surfactant, an adhesion accelerator, an antioxidant, aggregation inhibitor, or the like in the photosensitive colored composition of the present invention.

Specific examples of such additives include a filler such as glass, alumina, or the like; a polymer compound other than binding resin, such as polyvinyl alcohol, polyacrylic acid, polyethylene glycol mono alkylether, polyfluoro alkyl acrylate, or the like; a surfactant such as a nonionic-based agent, a cationic-based agent, an anionic-based, or the like; an adhesion accelerator such as vinyltrimethoxysilane, vinyltriethoxysilane, vinyl tris(2-methoxyethoxy)silane, N-(2-aminoethyl)-3-aminopropyl methyldimethoxysilane, N-(2-aminoethyl)-3-aminopropyl trimethoxysilane, 3-aminopropyl triethoxysilane, 3-glycidoxypropyl trimethoxysilane, 3-glycidoxypropyl methyldimethoxysilane, 2-(3,4-epoxycyclohexyl)ethyltrimethoxysilane, 3-chloropropyl methyl dimethoxysilane, 3-chloropropyl trimethoxysilane, 3-methacryloxypropyl trimethoxysilane, 3-mercaptopropyl trimethoxysilane, or the like; an antioxidant such as 2,2-thiobis(4-methyl-6-t-butylphenol), 2,6-di-t-butylphenol, or the like; an aggregation inhibitor such as sodium polyacrylate, or the like.

The photosensitive colored composition of the present invention may contain organic calboxylic acid, and preferably organic calboxylic acid of low molecular weight of not more than 1000 in order to accelerate the alkali dissolution property at an ultraviolet non-irradiated portion of the photosensitive colored composition and further improve the developing performance.

Specific examples of the organic calboxylic acid include an aliphatic monocarboxylic acid such as a formic acid, an acetic acid, a propionic acid, a butyric acid, a valeric acid, a pivalic acid, a caproic acid, a diethyl acetic acid, an enanthic acid, a caprylic acid, or the like; an aliphatic dicarboxylic acid such as an oxalic acid, a malonic acid, a succinic acid, a glutaric acid, an adipic acid, a pimelic acid, a suberic acid, an azelaic acid, a sebacic acid, a brassylic acid, a methylmalonic acid, an ethylmalonic acid, a dimethylmalonic acid, a methylsuccinic acid, a tetramethylsuccinic acid, a citraconic acid, or the like; an aliphatic tricarboxylic acid such as a tricarballylic acid, an aconitic acid, a camphoronic acid, or the like; an aromatic monocalboxylic acid such as a benzoic acid, a toluic acid, a cuminic acid, a hemellitic acid, a mesitylenic acid, or the like; an aromatic polycalboxylic acid such as a phthalic acid, an isophthalic acid, a terephthalic acid, a trimellitic acid, a trimesic acid, a mellophanic acid, a pyromellitic acid, or the like; another calboxylic acid such as a phenyl acetic acid, a hydratropic acid, a hydrocinnamic acid, a mandelic acid, a phenylsuccinic acid, an atropic acid, a cinnamic acid, a methyl cinnamate, a benzil cinnamate, a cinnamylidene acetic acid, a coumaric acid, an umbellic acid, or the like.

The photosensitive colored composition of the present invention can be preferably used for forming a color filter used in a liquid crystal display device (LCD), a solid-state imaging device (for example, CCD, CMOS, or the like) and coloring pixels such as an electroluminance color filter or the like, or alternatively for producing printing ink, ink jet ink, paint, or the like.

<<Color Filter and Method for Producing the Same>>

The color filter of the present invention is formed by arranging plural colored or uncolored patterns on a substrate, and manufactured using the above-mentioned photosensitive colored composition of the present invention. The color filter of the present invention can be produced in the most preferable manner by the method for producing the color filter of the present invention using the photosensitive colored composition of the present invention. Specifically, it is possible to form the color filter, for example, by applying (and preferably, drying thereafter) the photosensitive colored composition directly or via another layer onto the substrate to form a coating layer (hereinafter, this step is also referred to as a "coating film forming step" in some cases), exposing thus formed coating layer via a photomask (at least with ultraviolet rays, for example) in a form of an image (hereinafter, this step is also referred to as an "exposing step" in some cases), and developing the exposed coating layer with developing solution (for example, with an alkali developing solvent) (hereinafter, this step is also referred to as a "developing step" in some cases). In the present invention, it is possible to further provide, if necessary, subjecting the coating layer after the developing process, that is, the pattern to a heating process (hereinafter, this step is also referred to as a "post-baking step").

In the method for producing the color filter of the present invention, it is possible to further provide, if necessary, a curing step of causing the pattern after the exposure and the development to be cured by further heating and/or exposing the pattern.

In the above-mentioned coating film forming step, a radiation sensitive colored composition layer (coated layer) is formed by coating (and preferably drying thereafter) the photosensitive colored composition on, for example, a substrate, in a coating method such as a spin coating, a casting coating, a roll coating, a slit coating, or the like.

Examples of the substrate include a soda-lime glass, a PYREX (registered trademark) glass, a quartz glass, one obtained by adhering a transparent conductive film thereto, a photoelectric conversion element substrate to be used in an imaging element or the like, such as a silicon substrate, a complementary metal oxide semiconductor (CMOS), or the like. In some cases, each of these substrates is formed with a black matrix for isolating the respective pixel patterns constituting the color filter.

In addition, each of these substrates may be provided thereon with a base-coated layer, if necessary, in order to improve the adhesion with the layer to be provided on the substrate, prevent substances from being diffused, or form the substrate surface to be flat.

In the above mentioned exposing step, the coating layer formed in the above coated film forming step is irradiated and exposed with active rays or radial rays via the photomask in a specific pattern in a form of an image. Examples of the active rays or the radial rays include infrared rays, visible rays, ultraviolet rays, far-ultraviolet rays, x-rays, electron beams, or the like. However, the active rays or the radial rays are preferably at least ultraviolet rays. Particularly, ultraviolet rays such as g-rays, h-rays, or i-rays are preferably used. It is preferable that the exposure for the color filter for a solid-state imaging device is performed with a stepper exposing apparatus by mainly using i-rays.

Exposure illuminance for a proximity exposing apparatus and a mirror projection exposing apparatus, which are used for producing the color filter for a liquid crystal display apparatus, is preferably not less than 10 mW/cm$^2$, more preferably not less than 20 mW/cm$^2$, and particularly preferably not less than 30 mW/cm$^2$ from the view point of throughput. Exposure illuminance for a stepper exposing apparatus, which is used for producing the color filter for a solid-state imaging device, is preferably not less than 300 mW/cm$^2$, more preferably 500 mW/cm$^2$, and particularly preferably not less than 1000 mW/cm$^2$ from the view point of throughput as well. In addition, the exposure amount is generally preferably not more than 1000 mJ/cm$^2$, more preferably not more than 500 mJ/cm$^2$, and particularly preferably not more than 300 mJ/cm$^2$ from the view point of throughput as well.

In the developing step, the exposed coating layer is subjected to a developing process with developing solution thereby to make the pattern appear.

Any developing solution can be used as long as the developing solution can dissolve the unexposed portion of the photosensitive colored composition and does not easily dissolve the exposed portion (radial rays irradiated portion). Specifically, it is possible to use each of the various organic solvents, the combination thereof, and the alkali aqueous solution.

Examples of the organic solvents include the above-mentioned solvents which can be used in preparing the photosensitive colored composition.

Examples of the alkali aqueous solution include a sodium hydroxide, a potassium hydroxide, a sodium carbonate, a sodium silicate, a sodium methasilicate, an ammonia water, an ethylamine, a diethylamine, a dimethylethanolamine, a tetramethyl ammoniumhydroxide, a tetraethyl ammoniumhydroxide, a choline, a pyrrole, a piperidine, an 1,8-diazabi-cyclo-[5.4.0]-7-undecyne, or the like.

As the developing solution, it is preferable to use an alkali aqueous solution of which an alkali concentration is adjusted preferably to be pH 11 to 13, and more preferably to be pH 11.5 to 12.5. When the alkali concentration is not more than pH 13, it is possible to prevent the roughness or the delamination of the pattern and the lowering of the remaining film ratio. When the alkali concentration is not less than pH 11, it is possible to achieve a satisfactory developing speed and prevent the occurrence of the residue.

In the developing step, the developing process is performed using a developing solution such as the alkali aqueous solution. As a developing method, it is possible to employ, for example, a dip method, a spray method, a paddle method, or the like. It is preferable to perform the developing step at a developing temperature of 15 to 40° C. In addition, cleaning is generally performed with running water after the development.

In the method for producing the color filter of the present invention, it is preferable to provide a post-baking step to perform a heating process in order to cause the coating layer after the development to be sufficiently cured. The heating temperature for the post-baking step is preferably 100 to 300° C., and more preferably 150 to 250° C. The heating time is preferably about 10 minutes to 1 hour, and more preferably about 5 minutes to 30 minutes.

The color filter of the present invention can have plural patterns such as a pattern, in which color pixels and a black matrix or the like are regularly arranged, on the substrate. Each of the colored pixels constituting the color filter is generally constituted to have a square shape. In such a case, a side (maximum side) thereof is generally formed in a range of 1.5 to 200 μm. Among these, from the view points of effective use of the substrate such as a silicon wafer or the like, downsizing of the device using a solid-state imaging device, and high-speed operation of the solid-state imaging device, a side is preferably not more than 5 μm, more preferably not more than 4 μm, and particularly preferably not more than 3 μm.

The thickness of the respective color pixels in the color filter is not particularly limited. However, the thickness tends to be thinned from the view point of effective use of the substrate such as a silicon wafer and shading of the device using a solid-state imaging device. Specifically, the thickness is preferably not more than 2 μm, more preferably not more than 1.5 μm, and particularly preferably not more than 1.0 μm.

The content of the pigment in the colored pixels constituting the color filter is not particularly limited. However, the content is preferably not less than 25% by mass of the total solid content of the composition, more preferably not less than 30% by mass, and particularly preferably not less than 40% by mass from the view point of color separating.

The color filter of the present invention can be used as a color filter for a liquid crystal display apparatus (LCD). However, it is preferable that the color filter of the present invention is used as an image sensor for a CCD, a CMOS, or the like, particularly for a CCD device, a CMOS device, or the like with a high resolution over a million pixels. The color filter of the present invention is optimally used as a color filter to be arranged between a light receiving section in the respective color pixels constituting a CCD and a micro lens for collecting light beams.

EXAMPLES

Hereinafter, the present invention will be described more specifically according to Examples, but the invention is not limited to the following examples as long as the gist of the invention is not deviated. Unless otherwise noted, "parts" refer to parts by mass.
—Preparation of Pigment Dispersion Composition—
(Preparation of Magenta Pigment Dispersion Composition R-1)

The following composition components were mixed, stirred and mixed using a homogenizer at a rotating speed of 3,000 r.p.m. for 3 hours to prepare a mixture solution containing a pigment.
<Composition>
PIGMENT RED 122 (pigment) . . . 10 parts
DISPERBYK-163 (dispersant) . . . 2.3 parts
(manufactured by BYK Additives & Instruments, block copolymer dispersant)
benzyl methacrylate/methacrylic acid (=70/30 [molar ratio]) copolymer propylene glycol monomethyl ether acetate solution (45%, weight-average molecular weight 30000, manufactured by Fujikura Kasei Co., Ltd., Product Name: ACRYBASE FF-187) . . . 4.4 parts
propylene glycol monomethyl ether acetate (manufactured by Daicel Chemical Industries, Product Name: MMP-GAC) . . . 83.3 parts Subsequently, the mixture solution obtained by the above process was further subjected to a dispersing process with a bead disperser DISPERMAT (manufactured by VMA-GETZMANN GMBH), which employs zirconia beads with a size of 0.3 mmϕ for 6 hours. Thereafter, the resultant object was subjected to a dispersing process with a depressurizing mechanism-equipped high-pressure disperser NANO-3000-10 (manufactured by Nihon B.E.E. Co., Ltd.) under a pressure of 2,000 kg/cm$^3$ at a flow rate of 500 g/min.

This dispersing process was repeatedly performed 10 times to obtain the magenta pigment dispersion composition R-1.
(Preparation of Red Pigment Dispersion Composition R-2)

The following composition components were mixed, stirred and mixed using a homogenizer at a rotating speed of 3000 r.p.m for 3 hours to prepare a mixture solution containing a pigment.
<Composition>
PIGMENT RED 254 (pigment) . . . 10 parts
AJISPER PB821 (manufactured by Ajinomoto Fine-Techno Co., Ltd.: dispersant) . . . 2.3 parts
benzyl methacrylate/methacrylic acid (=70/30 [molar ratio]) copolymer propylene glycol monomethyl ether acetate solution (45%, weight-average molecular weight 30000, manufactured by Fujikura Kasei Co., Ltd., Product Name: ACRYBASE FF-187) . . . 4.4 parts
propylene glycol monomethyl ether acetate (manufactured by Daicel Chemical Industries, Product Name: MMP-GAC) . . . 83.3 parts Subsequently, the mixture solution obtained by the above process was further subjected to a dispersing process with a bead disperser DISPERMAT (manufactured by VMA-GETZMANN GMBH), which employs zirconia beads with a size of 0.3 mmϕ for 6 hours. Thereafter, the resultant object was further subjected to a dispersing process with a depressurizing mechanism-equipped high-pressure disperser NANO-3000-10 (manufactured by Nihon B.E.E. Co., Ltd.) under a pressure of 2,000 kg/cm$^3$ at a flow rate of 500 g/min. This dispersing process was repeatedly performed 10 times to obtain the red pigment dispersion composition R-2.

Example 1

Producing of Solid-State Imaging Device

—Preparing Resist Liquid for Flattened Film—
The following components were mixed and stirred using a homogenizer to prepare resist liquid for a flattened film.
<Composition of Resist Liquid for Flattened Film>
benzyl methacrylate/methacrylic acid (=70/30 [molar ratio]) copolymer propylene glycol monomethyl ether acetate solution (45%, weight-average molecular weight 30000, manufactured by Fujikura Kasei Co., Ltd., Product Name: ACRYBASE FF-187) . . . 22 parts
dipentaerythritol pentaacrylate . . . 6.5 parts
(manufactured by Nippon Kayaku Co., Ltd., Product Name; KAYARAD DPHA)
propylene glycol monomethyl ether acetate (manufactured by Daicel Chemical Industries, Product Name: MMP-GAC) . . . 13.8 parts
ethyl-3-ethoxypropionate (manufactured by Nagase & Co., Ltd., Product Name: ethyl-3-ethoxypropionate) . . . 12.3 parts
halomethyl triazine compound (hereinafter referred to as a compound I) (manufactured by PANCHIM Ltd., Product Name: triazine PP) . . . 0.3 parts

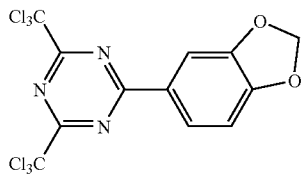

COMPOUND I

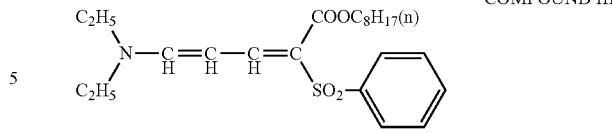

COMPOUND III

—Producing of Flattened Film—

The obtained resist liquid for a flattened film was coated onto a 6-inch silicon wafer by spin coating. Subsequently, the resultant object was subjected to a heating process on a hot plate at a surface temperature of the coated film of 120° C. for 120 seconds to obtain on the silicon wafer a coated film with a uniform thickness of about 2 μm. Thereafter, the coated film was subjected to a curing process using an oven under the condition of 220° C. for 1 hour to form a flattened film.

—Preparing of Photosensitive Colored Composition—

Subsequently, the pigment dispersant, which was obtained by kneading and dispersing the above magenta pigment dispersion composition R-1 with a sand mill disperser, was used to be mixed with the following composition components thereby to prepare the photosensitive colored composition.

<Composition of Photosensitive Colored Composition>
Resin A . . . 20.57 parts
(benzyl methacrylate/methacrylic acid (=70/30 [molar ratio]) copolymer propylene glycol monomethyl ether acetate solution (30%, weight-average molecular weight 30000, manufactured by Fujikura Kasei Co., Ltd., Product Name: ACRYBASE FF-187))
Monomer A . . . 1.46 parts
(dipentaerythritol pentaacrylate; manufactured by Nippon Kayaku Co., Ltd., Product Name; KAYARAD DPHA)
above magenta pigment dispersion composition R-1 . . . 55.80 parts
solvent A (organic solvent) . . . 16.75 parts
(propylene glycol monomethyl ether acetate; manufactured by Daicel Chemical Industries, Product Name: MMP-GAC)
initiator A (following compound II; manufactured by Chiba Specialty Chemicals Inc., Product Name: IRGACURE OXE01) . . . 0.314 parts
following compound III (ultraviolet absorber) . . . 0.576 parts
surfactant A . . . 0.36 parts
(fluorine-based surfactant; manufactured by DIC Corporation, Product Name; MEGAFAC F-144)
polymerization inhibitor A (p-methoxyphenol; manufactured by Kanto Chemical Co., Inc.,
Product Name: p-methoxyphenol) . . . 0.001 parts

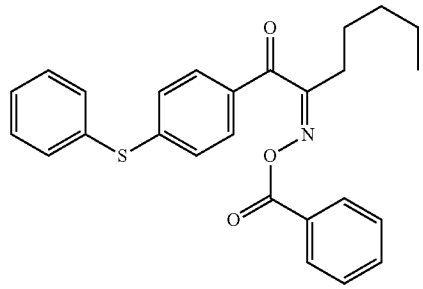

COMPOUND II

—Producing of Coated Film—

The photosensitive colored composition obtained in the above manner was coated on a flattened film of the silicon wafer by the spin coating, the resultant object was subjected to a heating process with a hot plate at a surface temperature of the coated film of 100° C. for 120 seconds to dry, and a coated film with a film thickness of about 1.0 μm was formed after the drying.

—Producing of Pixel Pattern of Color Filter—

Thereafter, an i-ray stepper (FPA-3000i5+ manufactured by Cannon Inc.) was used to perform the exposure with respect to the dried coated film via a mask pattern, in which pixels with 2.0 μm square shapes were respectively arranged in a region of 4 mm×3 mm on the substrate, at an exposure amount of 100 mJ/cm$^2$ and with two levels of the illuminance of 1200 mW/cm$^2$ (high illuminance) and 600 mW/cm$^2$ (low illuminance).

The coated film which had been subjected to the pattern exposure was then subjected to a paddle development at a room temperature for 60 seconds using 60% aqueous solution of organic alkali developing solution CD-2000 (manufactured by Fujifilm Electronics Materials Co., Ltd.), and rinsed with pure water using a spin shower for 20 seconds. Thereafter, the coated film was further washed with pure water. Then, water droplets were blown by high-pressure air, the substrate was naturally dried, and the coated film was subjected to a post-baking process with a hot plate at 220° C. for 300 seconds to form a colored pattern (colored resin-coated film) on the silicon wafer.

In the above-mentioned manner, the color filter for a solid-state imaging device was produced.

—Evaluation 1—

The following evaluation and measurement were performed for the color filter for a solid-state imaging device obtained in the above-mentioned manner. The results of the evaluation and the measurement were shown in the following Table 3.

(1-1) Shape of Pixel Pattern

The shape of the pixel pattern, of which each of the four sides is 2.0 μm, of the obtained color filter was observed using a length-measurement SEM (S-7800H manufactured by Hitachi Ltd.) from an upper direction of the color filter on the silicon wafer at a magnification of 30000 times to evaluate the shape of the corner based on the following evaluation criteria. In addition, a rounded corner shape may differ from the pattern shape of another color, which is adjacent at the time of producing the device, and undesirably measured as a mixed color and a noise at the time of image recognition. Accordingly, the rounded corner shape deteriorates the performance of the device.

<Evaluation Criteria>
A: The roundness of the corner was small, and a satisfactory rectangular shape was obtained.
B: The roundness of the corner was observed, but in a practically allowable range.
C: The fan-shaped roundness was observed at the corner, and a rectangular shape could not be obtained.

(1-2) Circumferential Residue

The pixel pattern of the color filter after the post-baking was observed using a length-measurement SEM (S-7800H manufactured by Hitachi Ltd.) from an upper direction of the color filter on the silicon wafer at a magnification of 30000 times to evaluate the existence of the generation of the residue visually based on the following evaluation criteria.

<Evaluation Criteria>
A: There was no developing residue.
B: A little developing residue was observed, but in a practically allowable range.
C: The generation of the residue was remarkably observed.

(1-3) Remaining Film Ratio

The film thickness $D^1$ of the pixel pattern of the color filter after the post-baking and the film thickness $D^2$ after the exposure and before the development were measured using a contact-type surface shape measuring instrument (DEKTAK8 manufactured by Veeco Instruments). The remaining film ratio (%;=$D^1/D^2 \times 100$) was obtained by dividing the obtained film thickness $D^1$ by the film thickness $D^2$, and the evaluation was made using this as an index based on the following evaluation criteria. In addition, it is preferable that the remaining film ratio is high from the view point of the exposure sensitivity.

<Evaluation Criteria>
A: The exposure sensitivity was satisfactory, and the remaining film ratio was not less than 70%.
B: The exposure sensitivity was insufficient, and the remaining film ratio was less than 70%.

(1-4) Line Width

The shape of the pixel pattern of the color filter after the exposure at 600 mW/cm² (low illuminance) and 1200 mW/cm² (high illuminance), then the development, and the post-baking was observed using a length-measurement SEM (S-7800H manufactured by Hitachi Ltd.) from an upper direction of the color filter on the silicon wafer at a magnification of 30000 times. The line width was evaluated based on the following evaluation criteria from the view point of an appropriate dimension with relation to the 2.0 ηm square pixel of the mask pattern.

<Evaluation Criteria>
A: The line with was not less than 1.80 μm and less than 2.20 μm.
B: The line with was less than 1.80 μm or not less than 2.20 μm.

(1-5) Dependency on Exposure Illuminance
—A. Line Width |a-b|—

For each of the pixel pattern obtained by the exposure with the two levels (high illuminance: 1200 mW/cm², low illuminance: 600 mW/cm²) as described above, both of the line width a (μm) at the low illuminance and the line width b (μm) at the high illuminance, which were obtained in the above evaluation of "(1-4) Line Width" are compared with each other, and the difference between the line widths (=−a-b|) was obtained as an index and evaluated based on the following criteria. Since it was important for the color filter for a solid-state imaging device that the line width of the obtained pattern was constant, 0.05 μm was used as a threshold value, and the evaluation was made. In addition, "| |" represents an absolute value.

<Evaluation Criteria>
A: The difference between the line widths was less than 0.05 μm.
B: The difference between the line widths was not less than 0.05 μm.

—B. Line Width |c-d|—

For each of the pixel pattern obtained by the exposure with the two levels (high illuminance: 1200 mW/cm², low illuminance: 600 mW/cm²) as described above, both of the remaining film ratio c (%) at the low illuminance and the remaining film ratio d (%) at the high illuminance, which were obtained in the above evaluation of "(1-3) Remaining Film Ratio" are compared with each other, and the difference between the remaining film ratios (=|c-d|) was obtained as an index and evaluated based on the following criteria. Since it was important for the color filter for a solid-state imaging device that the film thickness of the obtained pattern was constant, 1.0% was used as a threshold value, and the evaluation was made. In addition, "| |" represents an absolute value.

<Evaluation Criteria>
A: The difference between the remaining film ratios was less than 1.0%.
B: The difference between the remaining film ratios was not less than 1.0%.

Examples 2 to 12

Producing of Color Filter for Solid-State Imaging Device

The photosensitive colored composition was prepared, and the color filter was produced, in the same manner as in Example 1 other than that the composition of the photosensitive colored composition was changed from the one in Example 1 as shown in the following Table 1 to 2. In addition, the same evaluation as that in Example 1 was made. The results of the evaluation and the measurement are shown in the following Table 3.

Comparative Examples 1 to 6

Producing of Color Filter for Solid-State Imaging Device

The photosensitive colored composition was prepared, and the color filter was produced, in the same manner as in Example 1 other than that the composition of the photosensitive colored composition was changed from the one in Example 1 as shown in the following Table 1 to 2. In addition, the same evaluation as that in Example 1 was made. The results of the evaluation and the measurement are shown in the following Table 3.

TABLE 1

| | Resin | Monomer | Dispersion Composition | Organic Solvent | Photopolymerization Initiator | Ultraviolet Absorber or Antioxidant | Surfactant | Polymerization Inhibitor |
|---|---|---|---|---|---|---|---|---|
| Example 1 | Resin A (20.57 parts) | Monomer A (1.46 parts) | Dispersion Composition R-1 (55.80 parts) | Solvent A (16.75 parts) | Initiator A (0.314 parts) | Compound III (0.576 parts) | Surfactant A (0.36 parts) | Polymerization Inhibitor A (0.001 parts) |
| Example 2 | Resin A (18.82 parts) | Monomer A (1.46 parts) | Dispersion Composition R-1 (55.80 parts) | Solvent A (16.75 parts) | Initiator A (0.314 parts) | Compound IV (1.100 parts) | Surfactant A (0.36 parts) | Polymerization Inhibitor A (0.001 parts) |
| Example 3 | Resin A (16.49 parts) | Monomer A (1.46 parts) | Dispersion Composition R-1 (55.80 parts) | Solvent A (16.75 parts) | Initiator A (0.314 parts) | Compound V (1.800 parts) | Surfactant A (0.36 parts) | Polymerization Inhibitor A (0.001 parts) |

TABLE 1-continued

|  | Resin | Monomer | Dispersion Composition | Organic Solvent | Photopolymerization Initiator | Ultraviolet Absorber or Antioxidant | Surfactant | Polymerization Inhibitor |
|---|---|---|---|---|---|---|---|---|
| Example 4 | Resin A (17.39 parts) | Monomer A (1.46 parts) | Dispersion Composition R-1 (55.80 parts) | Solvent A (16.75 parts) | Initiator A (0.314 parts) | Compound VI (1.530 parts) | Surfactant A (0.36 parts) | Polymerization Inhibitor A (0.001 parts) |
| Example 5 | Resin A (21.30 parts) | Monomer A (1.46 parts) | Dispersion Composition R-1 (55.80 parts) | Solvent A (16.75 parts) | Initiator A (0.314 parts) | Compound VII (0.357 parts) | Surfactant A (0.36 parts) | Polymerization Inhibitor A (0.001 parts) |
| Example 6 | Resin A (20.66 parts) | Monomer A (1.46 parts) | Dispersion Composition R-1 (55.80 parts) | Solvent A (16.75 parts) | Initiator A (0.314 parts) | Compound VIII (0.550 parts) | Surfactant A (0.36 parts) | Polymerization Inhibitor A (0.001 parts) |
| Example 7 | Resin A (16.32 parts) | Monomer A (1.46 parts) | Dispersion Composition R-1 (55.80 parts) | Solvent A (16.75 parts) | Initiator A (0.314 parts) | Compound IX (1.850 parts) | Surfactant A (0.36 parts) | Polymerization Inhibitor A (0.001 parts) |
| Example 8 | Resin A (22.42 parts) | Monomer A (1.46 parts) | Dispersion Composition R-2 (55.80 parts) | Solvent A (16.75 parts) | Initiator A (0.314 parts) | Compound III (0.02 parts) | Surfactant A (0.36 parts) | Polymerization Inhibitor A (0.001 parts) |
| Example 9 | Resin A (22.29 parts) | Monomer A (1.46 parts) | Dispersion Composition R-2 (55.80 parts) | Solvent A (16.75 parts) | Initiator A (0.314 parts) | Compound V (0.06 parts) | Surfactant A (0.36 parts) | Polymerization Inhibitor A (0.001 parts) |
| Example 10 | Resin A (22.42 parts) | Monomer A (1.46 parts) | Dispersion Composition R-2 (55.80 parts) | Solvent A (16.75 parts) | Initiator A (0.314 parts) | Compound VII (0.02 parts) | Surfactant A (0.36 parts) | Polymerization Inhibitor A (0.001 parts) |

TABLE 2

|  | Resin | Monomer | Dispersion Composition | Organic Solvent | Photopolymerization Initiator | Ultraviolet Absorber or Antioxidant | Surfactant | Polymerization Inhibitor |
|---|---|---|---|---|---|---|---|---|
| Example 11 | Resin A (21.89 parts) | Monomer A (1.46 parts) | Dispersion Composition R-2 (55.80 parts) | Solvent A (16.75 parts) | Initiator A (0.314 parts) | Compound VIII (0.18 parts) | Surfactant A (0.36 parts) | Polymerization Inhibitor A (0.001 parts) |
| Example 12 | Resin A (22.29 parts) | Monomer A (1.46 parts) | Dispersion Composition R-2 (55.80 parts) | Solvent A (16.75 parts) | Initiator A (0.314 parts) | Compound IX (0.06 parts) | Surfactant A (0.36 parts) | Polymerization Inhibitor A (0.001 parts) |
| Comparative Example 1 | Resin A (17.22 parts) | Monomer A (1.46 parts) | Dispersion Composition R-1 (55.80 parts) | Solvent A (16.75 parts) | Initiator A (0.314 parts) | Compound X (1.58 parts) | Surfactant A (0.36 parts) | Polymerization Inhibitor A (0.001 parts) |
| Comparative Example 2 | Resin A (10.59 parts) | Monomer A (1.46 parts) | Dispersion Composition R-1 (55.80 parts) | Solvent A (16.75 parts) | Initiator A (0.314 parts) | Compound XI (3.57 parts) | Surfactant A (0.36 parts) | Polymerization Inhibitor A (0.001 parts) |
| Comparative Example 3 | Resin A (22.46 parts) | Monomer A (1.46 parts) | Dispersion Composition R-1 (55.80 parts) | Solvent A (16.75 parts) | Initiator A (0.314 parts) | Compound XII (0.01 parts) | Surfactant A (0.36 parts) | Polymerization Inhibitor A (0.001 parts) |
| Comparative Example 4 | Resin A (22.29 parts) | Monomer A (1.46 parts) | Dispersion Composition R-2 (55.80 parts) | Solvent A (16.75 parts) | Initiator A (0.314 parts) | Compound X (0.06 parts) | Surfactant A (0.36 parts) | Polymerization Inhibitor A (0.001 parts) |
| Comparative Example 5 | Resin A (22.09 parts) | Monomer A (1.46 parts) | Dispersion Composition R-2 (55.80 parts) | Solvent A (16.75 parts) | Initiator A (0.314 parts) | Compound XI (0.12 parts) | Surfactant A (0.36 parts) | Polymerization Inhibitor A (0.001 parts) |
| Comparative Example 6 | Resin A (22.47 parts) | Monomer A (1.46 parts) | Dispersion Composition R-2 (55.80 parts) | Solvent A (16.75 parts) | Initiator A (0.314 parts) | Compound XII (0.005 parts) | Surfactant A (0.36 parts) | Polymerization Inhibitor A (0.001 parts) |

Hereinafter, the structures of the compounds described in the column of the ultraviolet absorber and the like in Table 1 to 2 will be shown.

[chem. 9]

COMPOUND IV

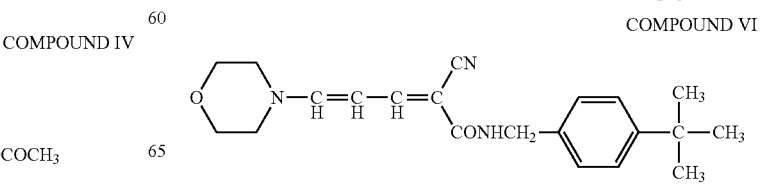

COMPOUND V

COMPOUND VI

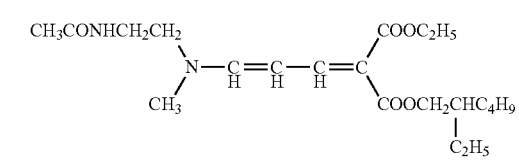

COMPOUND VII

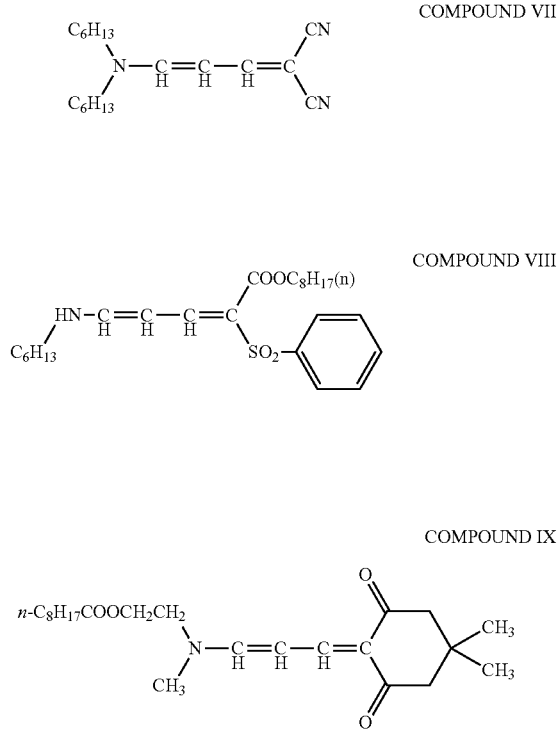

COMPOUND X

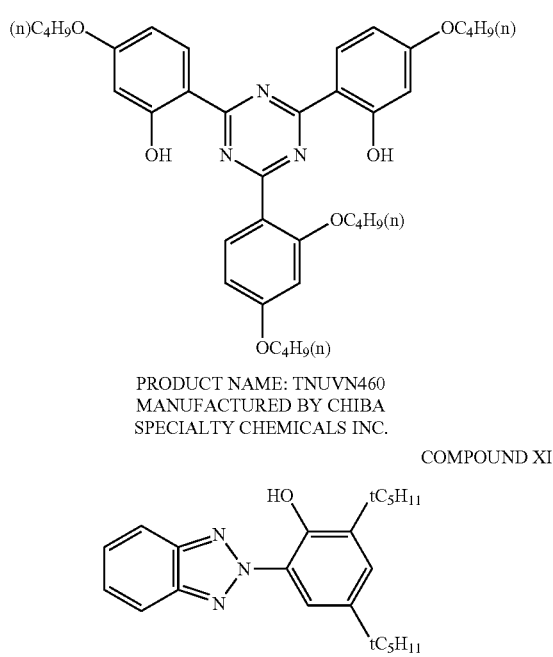

PRODUCT NAME: TNUVN460
MANUFACTURED BY CHIBA
SPECIALTY CHEMICALS INC.

COMPOUND XI

PRODUCT NAME: Sum isorb 350
MANUFACTURED BY SUMITOMO CHEMICAL CO., LTD.

COMPOUND XII (ANTIOXIDANT): Pentaerythritol Tetrakis [3-(3,5-Di-Tert-Butyl-4-Hydroxyphenyl)Propionate (MANUFACTURED BY CIBA-GEIGY K.K. "IRGANOX1010")

TABLE 3

| | Low Illuminance Exposure (600 mW/cm$^2$) | | | | High Illuminance Exposure (1200 mW/cm$^2$) | | | | Illuminance Dependency | |
|---|---|---|---|---|---|---|---|---|---|---|
| | a line Width [μm] | c Remaining Film Ratio [%] | Pattern Shape | Residue | b line Width [μm] | d Remaining Film Ratio [%] | Pattern Shape | Residue | Line Width \|a − b\| [μm] | Remaining Film Ratio \|c − d\| [%] |
| Example 1 | 2.10 A | 74.5 A | A | A | 2.02 A | 74.9 A | A | A | 0.01 A | 0.4 A |
| Example 2 | 2.00 A | 74.4 A | A | A | 2.01 A | 74.6 A | A | A | 0.01 A | 0.2 A |
| Example 3 | 2.02 A | 74.9 A | A | A | 2.04 A | 75.0 A | A | A | 0.02 A | 0.1 A |
| Example 4 | 1.99 A | 74.0 A | A | A | 2.02 A | 74.5 A | A | A | 0.03 A | 0.5 A |
| Example 5 | 2.01 A | 74.5 A | A | A | 2.04 A | 75.1 A | A | A | 0.03 A | 0.6 A |
| Example 6 | 2.00 A | 74.5 A | A | A | 2.02 A | 74.9 A | A | A | 0.02 A | 0.4 A |
| Example 7 | 2.02 A | 74.9 A | A | A | 2.04 A | 75.0 A | A | A | 0.02 A | 0.1 A |
| Example 8 | 1.97 A | 73.9 A | A | A | 2.01 A | 74.3 A | A | A | 0.04 A | 0.4 A |
| Example 9 | 2.02 A | 74.7 A | A | A | 2.04 A | 75.0 A | A | A | 0.02 A | 0.3 A |
| Example 10 | 1.96 A | 73.3 A | A | A | 1.99 A | 73.8 A | A | A | 0.03 A | 0.5 A |
| Example 11 | 1.98 A | 73.9 A | A | A | 2.01 A | 74.3 A | A | A | 0.03 A | 0.4 A |
| Example 12 | 2.02 A | 74.7 A | A | A | 2.03 A | 75.0 A | A | A | 0.01 A | 0.3 A |
| Comparative Example 1 | 1.75 B | 65.2 B | C | A | 1.98 A | 72.2 B | A | A | 0.23 B | 7.0 B |
| Comparative Example 2 | 1.76 B | 68.0 B | C | A | 2.01 A | 74.3 A | A | A | 0.16 B | 6.3 B |
| Comparative Example 3 | 2.00 A | 74.3 A | A | C | 2.04 A | 75.0 A | A | C | 0.04 A | 0.7 A |
| Comparative Example 4 | 1.78 B | 67.8 B | C | A | 2.04 A | 75.1 A | A | A | 0.19 B | 7.3 B |
| Comparative Example 5 | 1.78 B | 65.3 B | C | A | 2.04 A | 73.2 A | A | A | 0.26 B | 7.9 B |
| Comparative Example 6 | 1.95 A | 73.5 A | A | C | 2.01 A | 74.7 A | A | C | 0.06 B | 0.3 A |

* "| |" in the table represents an absolute value.

As shown in Table 3, the pattern shape was satisfactory, the residue was suppressed, and the dependency on the exposure illuminance was small in respective examples in which the ultraviolet absorber represented by the general formula (1) was used. On the contrary, the changing in the line width and the remaining film ratio were great especially for the low illuminance exposure, and it was not possible to suppress the dependency on the exposure illuminance in Comparative Examples in which triazin-based or benzotriazol-based ultraviolet absorber (compound X, compound XI), which was a different kind of ultraviolet absorber, was used. In addition, the dependency on the exposure illuminance was small to some extent, but it was not possible to suppress the generation of the development residue in Comparative Examples in which the compound XII, which was an antioxidant, was used.

Examples 13 to 24, Comparative Examples 7 to 12

Producing of Color Filter for Liquid Crystal Display Device

The photosensitive colored compositions used in Examples 1 to 12 and Comparative Examples 1 to 6 were prepared, and each of them was coated on a CrBM film of an individual Cr film-attached glass substrate (1737, manufactured by Corning Incorporated, 100 mm×100 mm) by spin coating such that the thickness thereof became 1.5 μm, and the coated film was formed.

Then, each of the Cr film-attached glass substrate formed with the coated film was dried (pre-baked) in an oven at 90° C. for 60 seconds, the exposure was performed on the entire surface of the coated film via the mask pattern, in which 100 μm stripes were arranged in a 4 mm×3 mm region on the substrate, using a high-pressure mercury lamp at the exposure amount of 100 mJ/cm$^2$ with two levels of the illuminance 20 mW/cm$^2$ (low illuminance) and 40 mW/cm$^2$ (high illuminance). Subsequently, 60% aqueous solution of organic alkali developing solution CD-2000 (manufactured by Fujifilm Electronics Materials Co., Ltd.) was added onto the coated film after the exposure, and the development was performed at a room temperature for 40 seconds in a stationary state. After the stationary state, pure water was sprayed in a shower manner, and the developing solution was rinsed off. Then, the coated film after the exposure and the development in the above manner was subjected to a heating process (post-baking) in an oven at 220° C. for 1 hour, and colored pattern (colored resin-coated film) was respectively formed on the Cr film-attached glass substrate.

As described above, 18 kinds of color filters for the liquid crystal display device were produced.

—Evaluation 2—

For each of the 18 kinds of color filters for the liquid crystal display device which was obtained in the above manner, the following evaluation was made. The results are shown in the following Table 4 to 5.

(2-1) Shape of Pixel Pattern

The pixel patterns, which had a 100 μm stripe shape, of the respective obtained color filters were cut along a plane perpendicular to the plane of the color filter, and the shape of the cut plane was observed using a SEM (S-4800 manufactured by Hitachi High-Technologies Corporation) at a magnification of 30000 times to evaluate the shape of the cut plane based on the following evaluation criteria. In addition, it is not desirable that when the cut plane has an inverse tapered shape, an ITO electrode to be attached later to the color filter for the liquid crystal display device is easily disconnected, and thus the voltage retention ratio of the liquid crystal cell is lowered, which causes a malfunction in the display in the liquid crystal display apparatus.

<Evaluation Criteria>
A: The shape of the cut plane was a forward tapered shape.
B: The shape of the cut plane was rectangular.
C: The shape of the cut plane was an inverse tapered shape.

(2-2) Remaining Film Ratio

For each of the pixel patterns obtained by the exposure with the two levels (high illuminance: 40 mW/cm$^2$, low illuminance: 20 mW/cm$^2$) as described above, the film thickness $D^1$ of the pixel pattern of the respective color filters after the post baking and the film thickness $D^2$ after the exposure and before the development were measured using a contact-type surface shape measuring instrument (Dektak8 manufactured by Veeco Instruments), and the remaining film ratio (%;=$D^1$/$D^2 \times 100$) was obtained by dividing the obtained film thickness $D^1$ by the film thickness $D^2$, the remaining film ratio was used as an index to perform the evaluation based on the following evaluation criteria. In addition, it is preferable that the remaining film ratio is high from the view point of the exposure sensitivity.

<Evaluation Criteria>
A: The exposure sensitivity was satisfactory, and the remaining film ratio was not less than 70%.
B: The exposure sensitivity was insufficient, and the remaining film ratio was less than 70%.

(2-3) Dependency on Exposure Illuminance (Remaining Film Ratio)

For each of the pixel patterns obtained by the exposure with the two levels (high illuminance: 40 mW/cm$^2$, low illuminance: 20 mW/cm$^2$) as described above, both of the remaining film ratio e (%) at the low illuminance and the remaining film ratio f (%) at the high illuminance, which were obtained in the evaluation of the above "(2-2) Remaining Film Ratio", were compared, the difference between the remaining film ratios (=|e-f|) was obtained as an index, and the evaluation was made based on the following evaluation criteria. Since it was important for the color filter for a liquid crystal display device that the film thickness of the obtained pattern was constant, 1.0% was used as a threshold value, and the evaluation was made.

<Evaluation Criteria>
A: The difference between the remaining film ratios was less than 1.0%.
B: The difference between the remaining film ratios was not less than 1.0%.

(2-4) Circumferential Residue

The shape of the pixel pattern of the respective color filters after the post-baking was observed using a length-measurement SEM (S-7800H manufactured by Hitachi Ltd.) from an upper direction of the color filter on the CrBM film-attached glass substrate at a magnification of 30000 times to evaluate the existence of the residue visually based on the following evaluation criteria.

<Evaluation Criteria>
A: No development residue was observed.
B: The development residue was slightly observed, but in a practically allowable range.
C: The generation of the residue was remarkably observed.

TABLE 4

| | Photosensitive Colored composition | Low Illuminance Exposure (20 mW/cm²) | | | High Illuminance Exposure (40 mW/cm²) | | | Illuminance Dependency |
|---|---|---|---|---|---|---|---|---|
| | | e Remaining Film Ratio [μm] | Pattern Shape | Residue | f Remaining Film Ratio [%] | Pattern Shape | Residue | Remaining Film Ratio \|e − f\| [%] |
| Example 13 | Photosensitive Colored composition of Example 1 | 76.5 A | A | A | 76.9 A | A | A | 0.4 A |
| Example 14 | Photosensitive Colored composition of Example 2 | 76.4 A | A | A | 76.6 A | A | A | 0.2 A |
| Example 15 | Photosensitive Colored composition of Example 3 | 76.9 A | A | A | 77.0 A | A | A | 0.1 A |
| Example 16 | Photosensitive Colored composition of Example 4 | 76.0 A | A | A | 76.5 A | A | A | 0.5 A |
| Example 17 | Photosensitive Colored composition of Example 5 | 76.5 A | A | A | 77.1 A | A | A | 0.6 A |
| Example 18 | Photosensitive Colored composition of Example 6 | 76.4 A | A | A | 76.9 A | A | A | 0.5 A |
| Example 19 | Photosensitive Colored composition of Example 7 | 76.9 A | A | A | 77.0 A | A | A | 0.1 A |
| Example 20 | Photosensitive Colored composition of Example 8 | 75.9 A | A | A | 76.3 A | A | A | 0.4 A |
| Example 21 | Photosensitive Colored composition of Example 9 | 76.7 A | A | A | 77.0 A | A | A | 0.3 A |
| Example 22 | Photosensitive Colored composition of Example 10 | 75.3 A | A | A | 75.8 A | A | A | 0.5 A |
| Example 23 | Photosensitive Colored composition of Example 11 | 75.8 A | A | A | 76.3 A | A | A | 0.5 A |
| Example 24 | Photosensitive Colored composition of Example 12 | 76.7 A | A | A | 77.1 A | A | A | 0.4 A |

* "\|  \|" in the table represents an absolute value.

TABLE 5

| | Photosensitive Colored composition | Low Illuminance Exposure (20 mW/cm²) | | | High Illuminance Exposure (40 mW/cm²) | | | Illuminance Dependency |
|---|---|---|---|---|---|---|---|---|
| | | e Remaining Film Ratio [μm] | Pattern Shape | Residue | f Remaining Film Ratio [%] | Pattern Shape | Residue | Remaining Film Ratio \|e − f\| [%] |
| Comparative Example 7 | Photosensitive Colored composition of Comparative Example 1 | 67.2 B | C | A | 74.2 A | A | A | 7.0 B |
| Comparative Example 8 | Photosensitive Colored composition of Comparative Example 2 | 69.5 B | C | A | 76.3 A | A | A | 6.8 B |
| Comparative Example 9 | Photosensitive Colored composition of Comparative Example 3 | 76.3 A | A | C | 77.0 A | A | C | 0.7 A |
| Comparative Example 10 | Photosensitive Colored composition of Comparative Example 4 | 69.8 B | C | A | 77.1 A | A | A | 7.3 B |
| Comparative Example 11 | Photosensitive Colored composition of Comparative Example 5 | 67.3 B | C | A | 75.2 A | A | A | 7.9 B |
| Comparative Example 12 | Photosensitive Colored composition of Comparative Example 6 | 75.5 A | A | C | 76.7 A | A | C | 1.2 A |

* "\|  \|" in the table represents an absolute value.

As shown in Table 4 to 5, the pattern shape was satisfactory, the residue was suppressed, and the exposure dependency was small in the respective examples in which the compound represented by the general formula (I) was used.

On the contrary, changing in the pattern shape and the remaining film ratio were great especially for the low illuminance exposure, and it was not possible to suppress the dependency on the exposure illuminance, in the respective comparative examples in which triazine series or benzotriazol series ultraviolet absorber (compound X, compound XI), which was a different kind of ultraviolet absorber, was used. In addition, it was not possible to suppress the generation of the developing residue in the respective comparative examples in which a compound XII, which is an antioxidant, was used.

The entire contents disclosed in Japanese Application No. 2008-032220 and Japanese Application No. 2008-093839 are incorporated in this specification by reference.

All contents of the documents, patent applications, and technical standards described in this specification are incorporated herein by reference to the same extent as that when it is specifically and individually described that the respective documents, patent applications, and the technical standards are incorporated herein by reference.

The invention claimed is:

1. A photosensitive colored composition comprising:
a pigment;
a polymerizable monomer;
a photopolymerization initiator; and a compound represented by the following general formula (I):

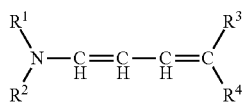

General Formula (I)

wherein, in general formula (I), each of $R^1$ and $R^2$ independently represents an alkyl group with 1 to 20 carbon atoms, where $R^1$ and $R^2$ may be the same or different from each other; $R^1$ and $R^2$ may form a cyclic amino group with a nitrogen atom; $R^3$ represents —COOR$^5$; $R^4$ represents a cyano group or —SO2R$^6$; $R^5$ represents an alkyl group with 1 to 20 carbon atoms or an aryl group with 6 to 20 carbon atoms; $R^6$ represents an alkyl group with 1 to 20 carbon atoms or an aryl group with 6 to 20 carbon atoms; and $R^3$ and $R^4$ are not combined with each other to form a ring.

2. The photosensitive colored composition according to claim 1, wherein the content of the compound represented by the general formula (I) is 0.01 to 10% by mass relative to the total solid content of the photosensitive colored composition.

3. The photosensitive colored composition according to claim 1, wherein at least one kind of the photopolymerization initiator is an oxime ester compound.

4. The photosensitive colored composition according to claim 1, wherein each of $R^1$ and $R^2$ independently represents a lower alkyl group with 1 to 8 carbons.

5. The photosensitive colored composition according to claim 1, wherein $R^3$ is an electron withdrawing group whose $\sigma_p$ value is from 0.30 to 0.80.

6. The photosensitive colored composition according to claim 1, wherein the photopolymerization initiator is at least one of 2-(O-benzoyl oxime)-1-[4-(phenylthio)phenyl]-1,2-octanedione or 1-(O-acetyl oxime)-1-[9-ethyl-6-(2-methylbenzoyl)-9H-carbazole-3-yl]ethanone.

7. The photosensitive colored composition according to claim 1, wherein the pigment is a pigment for forming a red color, and the photosensitive colored composition is configured to have a magenta or red color.

8. A method for producing a color filter, comprising:
applying the photosensitive colored composition according to claim 1 as a coating layer;
exposing the thus formed coating layer via a photomask; and
developing the coating layer to form a pattern.

9. A color filter produced by the method for producing the color filter according to claim 8.

10. The photosensitive colored composition according to claim 1, wherein each of $R^1$ and $R^2$ independently represents an unsubstituted methyl group, an unsubstituted ethyl group, an unsubstituted propyl group, an unsubstituted butyl group, or an unsubstituted hexyl group.

11. The photosensitive colored composition according to claim 1, wherein $R^4$ represents —SO$_2$R$^6$, and R$^6$ represents an alkyl group with 1 to 20 carbon atoms or an aryl group with 6 to 20 carbon atoms.

12. The photosensitive colored composition according to claim 1, wherein the compound represented by general formula (I) is a compound represented by any one of the following formula (1), (2) or (11):

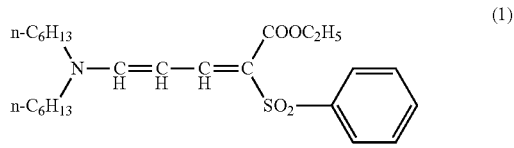

(1)

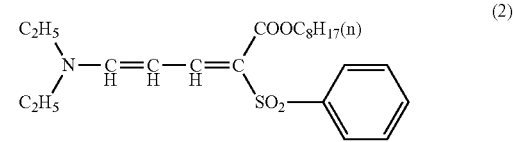

(2)

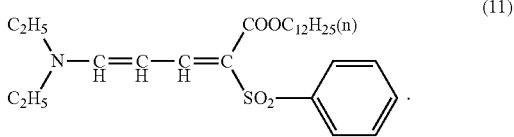

(11)

13. The photosensitive colored composition according to claim 1, wherein at least one kind of the photopolymerization initiator is 1-(O-acetyl oxime)-1-[9-ethyl-6-(2-methylbenzoyl)-9H-carbazole-3-yl]ethanone.

* * * * *